US006252807B1

United States Patent
Suzuki et al.

(10) Patent No.: US 6,252,807 B1
(45) Date of Patent: Jun. 26, 2001

(54) MEMORY DEVICE WITH REDUCED POWER CONSUMPTION WHEN BYTE-UNIT ACCESSED

(75) Inventors: Tomoaki Suzuki; Haruko Sonpachi, both of Tokyo (JP)

(73) Assignees: Mitsubishi Electric Engineering Company, Limited; Mitsubishi Denki Kabushiki Kaisha, both of Tokyo (JP)

(*) Notice: Subject to any disclaimer, the term of this patent is extended or adjusted under 35 U.S.C. 154(b) by 0 days.

(21) Appl. No.: 09/457,529

(22) Filed: Dec. 9, 1999

(30) Foreign Application Priority Data

Aug. 6, 1999 (JP) .................................... 11-224051

(51) Int. Cl.[7] ...................................................... G11C 7/00
(52) U.S. Cl. ........................................ 365/193; 365/238.5
(58) Field of Search ............................... 365/193, 238.5, 365/230.06, 149

(56) References Cited

U.S. PATENT DOCUMENTS 5,115,411 * 5/1992 Kass ................................. 365/189.01
5,781,496 * 7/1998 Pinkham ......................... 365/230.03
5,949,736 * 9/1999 Sugita ............................. 365/230.06

FOREIGN PATENT DOCUMENTS 5-290573   11/1993 (JP) .

* cited by examiner

Primary Examiner—A. Zarabian
(74) Attorney, Agent, or Firm—Burns, Doane, Swecker & Mathis, LLP

(57) ABSTRACT

A memory device is arranged in such a manner that an access-target memory cell is selected from a plurality of memory cells in accordance with the level of the byte-enable signal at the timing when the level of the corresponding row address strobe signal (/RAS signal) changes, and by this arrangement, the problem resided in the conventional memory device that it could not be decided as to whether a memory block in the DRAM core was to be a selected or non-selected byte until the fall of the corresponding column address strobe signal (/CAS signal), and thus the column decoder and the preamplifier that start operating at the fall of the /RAS signal could not be efficiently controlled is solved, and due to this, electric power that might otherwise be consumed at the time of executing a byte-unit access to the wide-bus DRAM can be reduced.

8 Claims, 21 Drawing Sheets

MEMORY DEVICE WITH REDUCED POWER CONSUMPTION WHEN BYTE-UNIT ACCESSED

BACKGROUND OF THE INVENTION

1. Field of the Invention

The present invention relates to a memory device that makes a byte-unit access to a DRAM, particularly to a wide-bus DRAM core stored in a system LSI.

2. Description of the Related Art

First of all, the background of the present invention is briefly explained.

Due to the recent drastic fall of the price of general-purpose memories, people have more expectation for system LSIs, above all for those provided with a DRAM having a vast capacity and logic elements in a hybrid manner, as they are capable of implementing an improvement of transmission rate between the DRAM and logic elements, and a reduction of power consumption by storing a wide-bus DRAM of 128 bits and/or 256 bits therein, which are additional values that the general-purpose DRAMS are not provided with.

However, as the bus width provided by the general purpose DRAMs is usually as wide as 32 bits at most, users of the conventional general purpose DRAMs have been demanding DRAM cores of 32-bit or 64-bit narrow width. This requirement of the users has been compensated by carrying out a byte-unit access in which the wide-bus DRAM is controlled by many /CAS (column address strobe) signals.

FIG. 18 is a schematic diagram showing the configuration of a conventional memory device (a 128-bit DRAM core). In the figure, each reference numeral 1 denotes a byte-unit memory block storing therein memory cells configuring the DRAM core, reference numeral 2 denotes a column decoder for decoding a column address, numeral 3 denotes a memory cell storing therein a sense amplifier, 4 denotes a one-byte preamplifier that reads one-byte data from the memory cell 3 and amplifies the signal level of the thus read data, and numeral 5 denotes a one-byte output buffer that temporally holds the one-byte data output from the preamplifier 4 and externally outputs the thus held data.

Further, reference numeral 6 denotes a one-byte input buffer that inputs data to be stored in the memory cell 3 and temporally stores the thus input data, numeral 7 denotes a one-byte write buffer for writing the data fed from the input buffer 6 into the memory cell 3, numeral 8 denotes a CAS buffer that inputs a /CAS<i> signal (i=0~15 throughout the specification) and outputs a control signal for controlling the output buffer 5 and so on, numerals 9 and 10 denote logic elements, 11 denotes an AND circuit for performing AND-ing operation of /CASFF<i> signals output from the CAS buffer 8 of each of the memory blocks, 12 denotes a clock generator, 13–15 denote logic elements, 16 denotes a column address buffer for storing a column address, 17 denotes a row address buffer for storing a row address, and numeral 18 denotes a row decoder for decoding the row address.

FIG. 19 is a schematic diagram showing the detailed inner configuration of the memory block 1. In this figure, reference numeral 1a denotes a one-bit memory block, numeral 2a denotes a one-bit column decoder, 3a denotes a memory cell that allows an access of bit-unit data, 4a denotes a one-bit preamplifier, 5a denotes a one-bit output buffer, 6a denotes a one-bit input buffer, and numeral 7a denotes a one-bit write buffer.

It is to be noted that when the CAS buffer 8 inputs a /CAS<i> signal of L level (hereinafter may be referred to as "L" level or just "L"), input or output of one-byte data is enabled, and a /CASFF<i> signal output from the CAS buffer 8 is ANDed by an AND circuit 11 with other /CASFF<i> signals, so as to generate a /CASM signal that controls the entire DRAM.

Further, a /CASF<i> signal output from the CAS buffer 8 generates a WBE<i> signal for controlling the one-byte write buffer 7, in cooperation with a WBEM signal which is common to all bytes, whereas a /CASD<i> signal, which is also output from the CAS buffer 8, generates an OE<i> signal for controlling the one-byte output buffer 5, in cooperation with an OEM signal which is common to all bytes.

Further, a CDEM signal, a PAEM signal and a DILM signal, respectively controlling the column decoder 2, the preamplifier 4 and the input buffer 6, and an ODLM signal for writing data from a latch circuit (hereinafter referred to just as a "latch") in the preamplifier 4 to that of the output buffer 5 are all common to all bytes.

The block shown in the left side of FIG. 20 is a decoder circuit for generating a plurality of /CAS<i> signals and outputting these signals to a 128-byte DRAM core, wherein the decoder circuit 20 inputs an ABS signal capable of simultaneously selecting all bytes, and generates CAS<0> to CAS<15> signals (hereinafter CAS<0~15>) for specifying each byte in combination with address signals A<0> to A<3> (abbreviated hereinafter to A<0~3>) and a main /CAS signal.

When executing a byte-unit accessing operation, in the case that the ABS signal is in the "L" level, the address signals A<0~3> can be regarded as corresponding to column address CA<5~8> which are upper than the column address CA<0~4> of the DRAM.

FIG. 21 is a diagram showing the data corresponding to each of the CAS<i> signals and the assignment of the address signals A<0~3> to the column address CA<5~8> at the time of the above byte-unit accessing operation.

The operation of the conventional memory device is now explained below.

The explanation is given with reference to FIGS. 22 and 23, on the assumption that the memory block 1 which is controlled by the /CAS<1> signal is a non-selected byte, and the memory block 1 which is controlled by the /CAS<2> signal is a selected byte.

In the data reading mode as shown in FIG. 22, each of the CDEM signal and the PAEM signal, which are common to all bytes, becomes a pulse signal of "H" level in accordance with the change of the column address after the fall of the /RAS (row address strobe) signal which is an external input of the DRAM core.

On this occasion, in both the selected and non-selected bytes, the column decoder 2 and the preamplifier 4 operate, whereby the latch of the preamplifier 4 reads out one-byte data (designated by the column address and the row address) from the memory cell 3 and stores therein.

In the selected byte, when the /CASM signal, that controls the entire DRAM, falls due to the fall of the /CAS<2> signal, the level of the CDEM signal and that of the PAEM signal are fixed to "L", and thereafter, when the level of the ODLM signal becomes "L", the data fed from the latch of the preamplifier 4 is written into the latch of the output buffer 5.

Thereafter, in the selected byte, when the level of the OE<2> signal is fixed to "H" due to the fact that the OEM signal becomes "H" level, the data is output externally from the latch of the output buffer 5.

On the other hand, in the non-selected byte, since the level of the /CAS<1> signal is held in the "H" level, the OE<1> signal is fixed to "L" level, so that no data is output from the latch of the output buffer 5.

In the data writing mode as shown in FIG. 23, the CDEM signal which is common to all bytes becomes a pulse signal of "H" level in accordance with the change of the column address after the fall of the /RAS signal which is an external input of the DRAM core. On this occasion, the column decoder 2 operates in both the selected and non-selected bytes.

In the selected byte, when the /CASM signal that controls the entire DRAM falls due to the fall of the /CAS<2> signal, the level of the CDEM signal becomes "L".

At the time of early writing, the DILM signal becomes a pulse signal of "L" level due to the fall of the /CASM signal, and the input buffer 6 inputs a data to be written from outside.

Thereafter, when the level of the WBEM signal which is a control signal common to all bytes becomes a pulse signal of "H" level, in the selected byte, the WBE<2> signal becomes a pulse signal of "H" level, and the data held in the latch of the input buffer 6 is written into the memory cell 3.

On the other hand, in the non-selected byte, sine the WBE<1> signal is still in the "L" level, the data held in the latch of the input buffer 6 is not written into the memory cell 3.

Note that in FIGS. 22 and 23, tASR and tRAH respectively denote a set-up time and a hold time of the row address of the DRAM, whereas tASC and tCAH denote respectively a set-up time and a hold time of the column address.

Since the conventional memory cell is configured as such, although the memory block 1, which receives a /CAS<i> signal whose signal level changes from "H" to "L" after the fall of the /RAS signal, becomes a selected byte, it cannot be decided as to whether the corresponding memory block 1 becomes a selected or a non-selected byte as long as the /CAS<i> signal does not fall.

Due to this, the column decoder 2 and the preamplifier 4, which start operating in accordance with the fall of the /RAS signal, cannot be controlled (in other words, even in the case where the corresponding memory block 1 becomes a non-selected byte, the column decoder 2 and the preamplifier 4 cannot be inactivated, and thus, they operate unnecessarily), and accordingly there has been such a problem that the overall power consumption cannot be reduced efficiently.

SUMMARY OF THE INVENTION

The present invention has been proposed to solve the problems aforementioned, and it is an object of the present invention to provide a memory device capable of reducing power consumption when it carries out a byte-unit access to a wide-bus DRAM.

In order to achieve the above object, a memory device according to the first aspect of the present invention comprises; a plurality of memory cells configuring a DRAM, a selection means for selecting one access-target memory cell out of the plurality of memory cells in accordance with level of a byte-enable signal at the change of the level of a row address strobe signal, a reading means for reading byte-unit data from the access-target memory cell selected by the selection means, and a writing means for writing byte-unit data into the access-target memory cell selected by the selection means.

The memory device according to another aspect of the present invention is constructed such that when the level of the byte-enable signal associated with an arbitrary memory cell is in the "L" level at the fall of the row address strobe signal, the selection means eliminates the memory cell from being an access-target memory cell, whereas when the level of the byte-enable signal associated with an arbitrary memory cell is in the "H" level, it determines the memory cell to be an access-target memory cell.

The memory device according to another aspect is constructed in such a manner as to inactivate the reading means and writing means which are connected with the memory cell eliminated from being an access-target memory cell.

The memory device according to further aspect of the present invention is constructed such that it comprises a plurality of memory cells configuring a DRAM, a selection means for selecting one access-target memory cell out of said plurality of memory cells in accordance with the level of a byte-enable signal at the change of the level of a row address strobe signal and that of a column address strobe signal, together with the reading means and the writing means provided in the memory device according to the first aspect of the invention.

The memory device according to further aspect of the present invention is constructed such that it determines an arbitrary memory cell to be an access-target memory cell, only when the level of the byte-enable signal associated with the arbitrary memory cell is in the "H" level at the fall of the row address strobe signal and that of the column address strobe signal.

The memory device according to further aspect of the present invention is constructed in such a manner as to inactivate the reading means and the writing means which are connected with a memory cell eliminated from being an access-target memory cell.

The memory device according to further aspect of the present invention is constructed in such a manner that even when the byte-enable signal is in the "H" level at the fall of the row address strobe signal, if the byte-enable signal is in the "L" level at the fall of the column address strobe signal, the selection means inactivates only some particular elements configuring the reading means and the writing means.

The memory device according to still further aspect of the present invention is constructed such that it comprises a decode means for generating a byte-enable signal in accordance with an address signal.

DETAILED DESCRIPTION OF THE PREFERRED EMBODIMENTS

Several embodiments of the present invention are now explained hereinafter.

(First Embodiment)

Figure 1:
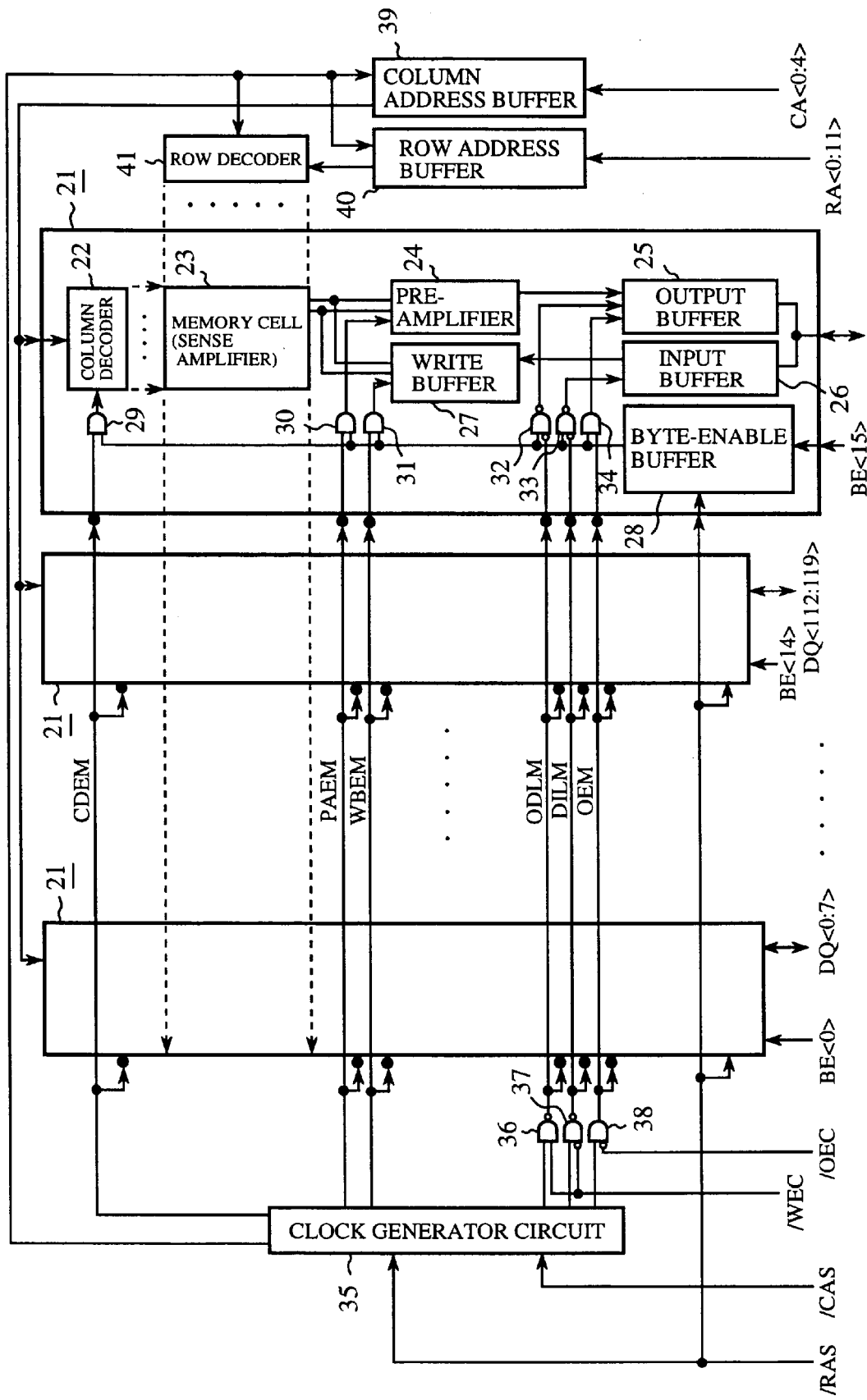
FIG. 1 is a schematic diagram showing a memory device according to a first embodiment of the present invention.

FIG. 1 is a schematic diagram showing a memory device according to a first embodiment of the present invention. In the figure, each of reference numeral 21 denotes a byte-unit memory block with memory cells stored therein configuring a DRAM, numeral 22 denotes a column decoder for decoding a column address, numeral 23 denotes a memory cell storing therein a sense amplifier, 24 denotes a one-byte preamplifier (reading means) that reads one-byte data from the memory sell 23 and amplifies the signal level of the thus read data, and numeral 25 denotes a one-byte output buffer (reading means) that temporally holds the data output from the preamplifier 24 and outputs the thus held data externally.

Further, reference numeral 26 denotes a one-byte input buffer (writing means) that inputs data to be stored in the memory cell 23 and latches it temporally, numeral 27 denotes a one-byte write buffer (writing means) for writing the data fed from the input buffer 26 into the memory cell 23, numeral 28 denotes a byte-enable buffer (selection means) that controls the output buffer 25 and so on in accordance with the signal level of a BE<i> signal in the case that the level of the /RAS signal is changed, numerals 29 through 34 denote logic elements (selection means), numeral 35 denotes a clock generating circuit (selection means) for outputting various signals on the basis of the /RAS signal and the /CAS signal, numeral 36, 37 and 38 denote logic elements (selection means), numeral 39 denotes a column address buffer for storing a column address, 40 denotes a row address buffer for storing a row address, and numeral 41 denotes a row decoder for decoding the row address.

Figure 2:
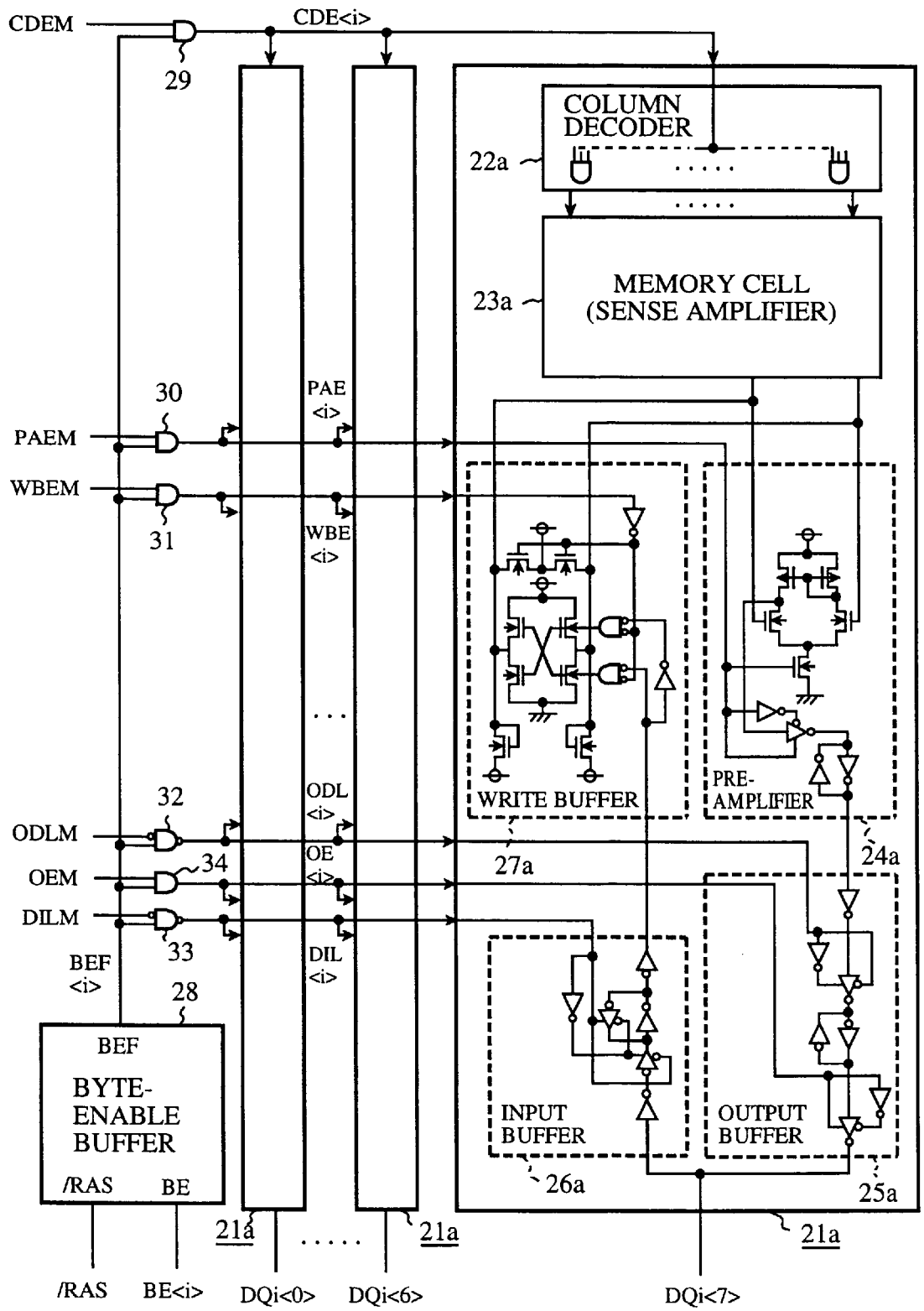
FIG. 2 is a schematic diagram showing the detailed inner construction of the memory block 21.

FIG. 2 is a schematic diagram showing the detailed inner configuration of the memory block 21. In the figure, reference numeral 21a denotes a one-bit memory block, 22a denotes a one-bit column decoder, 23a denotes a memory cell that allows an access of one-bit data, 24a denotes a one-bit preamplifier, 25a denotes a one-bit output buffer, 26a denotes a one-bit input buffer and numeral 27a denotes a one-bit write buffer.

It is to be noted that in the memory device of FIG. 1, there exists a BE<i> signal which is a byte-enable signal, instead of the /CAS<i> signal for each byte used in the conventional device, and there is only one /CAS signal provided for controlling the entire DRAM core in the independent manner.

Further, in each of the memory blocks 21, there exists a byte-enable buffer 28 that inputs a BE<i> signal instead of a /CAS signal, and all the byte-enable buffers 28 are controlled by the /RAS signal.

The BEF<i> signal which is an output signal of the byte-enable buffer 28 controls the column decoder 22, the preamplifier 24, the write buffer 27, the output buffer 25 and the input buffer 26, respectively together with the CDEM signal, the PAEM signal, the WBEM signal, the ODLM signal, the OEM signal and the DILM signal which are all control signals common to all bytes.

Figure 3:
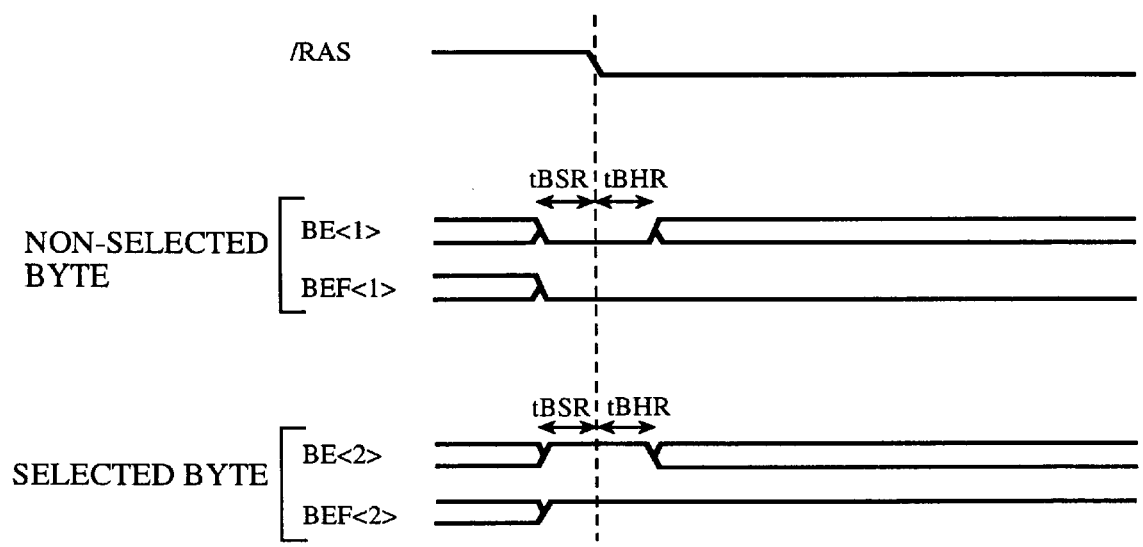
FIG. 3 is a timing chart showing the operation of the byte-enable buffer 28.

The byte-enable buffer 28 is a circuit which, as shown in FIG. 3, outputs a BEF<i> signal of the "L" level when the BE<i> signal becomes "l" at the fall of the /RAS signal (in the case of the memory block 21 being a non-selected byte), whereas it outputs a BEF<i> signal of the "H" level when the BE<i> signal becomes "H" at the fall of the /RAS signal (in the case of the memory block 21 being a selected byte).

Figure 4:
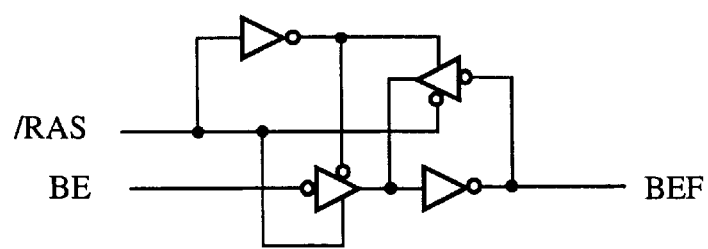
FIG. 4 is a circuit diagram showing an exemplary structure of the byte-enable buffer 28.

FIG. 4 is a circuit diagram showing an exemplary structure of the byte-enable buffer 28 which is composed of four logic elements.

The operation of the memory device according to this first embodiment is now explained as follows.

Figure 5:
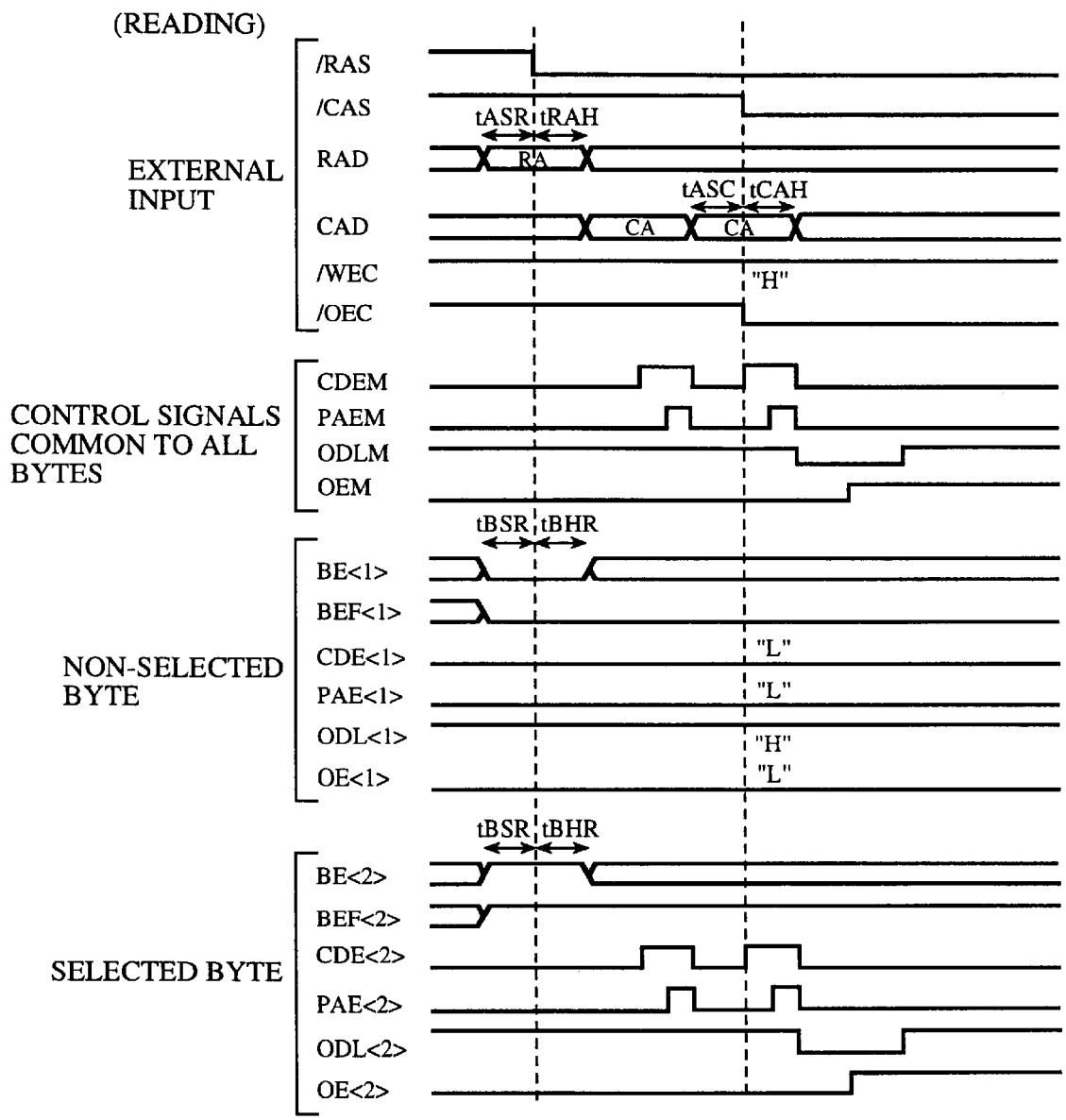
FIG. 5 is a timing chart showing the operation performed in the data reading mode.
Figure 6:
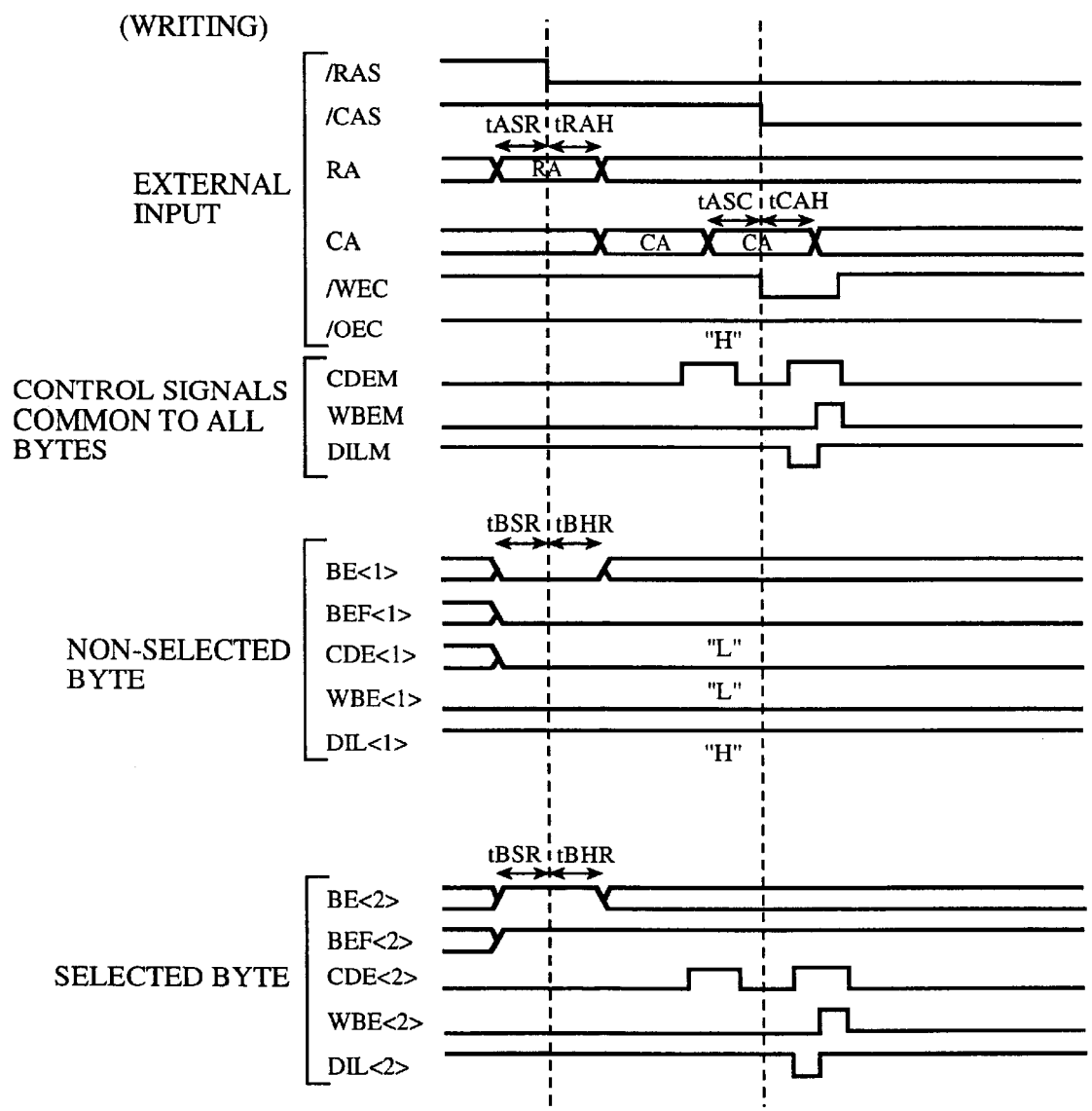
FIG. 6 is a timing chart showing the operation performed in the data writing mode.

The explanation is given with reference to FIGS. 5 and 6, on the assumption that the memory block 21 which is controlled by the BE<1> signal is a non-selected byte with respect to the row address, and the memory block 21 which is controlled by the /BE<2> signal is a selected byte with respect to the row address. Note that the operations of the control signals common to all bytes with respect to external inputs are same as those of the conventional ones.

In the data reading mode as shown in FIG. 5, since in the case of the non-selected byte, the level of the BE<1> signal becomes "L" at the fall of the /RAS signal, the level of the BEF<1> signal becomes "L".

Due to this, as the level of the CDE<1> signal, the PAE<1> signal and of the OE<1> signal all become "L" and the level of the ODL<1> signal becomes "H", the column decoder 22, the preamplifier 24 and the output buffer 25 do not operate, and thus the data in the memory cell 23 is not output.

On the other hand, in the case of the selected byte, the level of the BE<2> signal becomes "H" at the fall of the /RAS signal, and accordingly the level of the BEF<2> signal becomes "H". Due to this, since the level of the CDE<2> signal, the PAE<2> signal, the ODL<2> signal and of the OE<2> signal all become pulse signals of "H" level and the like, the column decoder 22, the preamplifier 24 and the output buffer 25 operate, and thus the data in the memory cell 23 is output from the output buffer 25.

Next, in the data writing mode as shown in FIG. 6, since in the case of the non-selected byte, the level of the BE<1> signal becomes "L" at the fall of the /RAS signal, the level of the BEF<1> signal becomes "L".

Due to this, as the level of the CDE<1> signal and that of the WBE<L> signal become "L" and the level of the DIL<1> signal becomes "H", the column decoder 22, the write buffer 27 and the input buffer 26 do not operate, and thus the data in the memory cell 23 is not written into the memory cell 23.

On the other hand, in the case of the selected byte, the level of the BE<2> signal becomes "H" at the fall of the /RAS signal, and accordingly the level of the BEF<2> signal becomes "H". Due to this, since the level of the CDE<2> signal, the WBE<2> signal, and of the DIL<2> signal all become pulse signals of either "H" level or "L" level, the column decoder 22, the write buffer 27 and the input buffer 26 operate, and thus the input data is written into the memory cell 23.

As is obvious form the above, according to this first embodiment, since it is arranged such that an access-target memory cell is selected from a plurality of memory cells in accordance with the level of the BE<i> signal at the fall of /RAS signal, in the case that the corresponding memory block 21 is a non-selected byte, the circuits that start operating du e to the fall of the /RAS signal (namely, the column decoder 22, the preamplifier 24 and the output buffer 25 in the data reading mode, and the column decoder 22, the write buffer 27 and the input buffer 26 in the data writing mode) can be inactivated, and a s a result, the electric power consumed for byte-unit accessing operation can be reduced.

It is to be noted that since the BE<i> signal is formed independently from the /RAS signal, if, as shown in FIGS. 5 and 6, a decoder circuit for generating the BE<i> signal having a set-up time (tBSR) and a hold time (tBHR) at the fall of the /RAS signal is formed, the circuits that start operating immediately after the fall of the /RAS signal can be inactivated.

Further, if these set-up time (tBSR) and the hold time (tBHR) of the BE<i> signal are set with respect to the set-up time (tASR) and the hold time (tRAH) of the row address of the DRAM in such a relation as tASR=tBSR, and tRAH= tBHR, then the BE<i> signal can be treated just as the row address.

(Second Embodiment)

Figure 7:
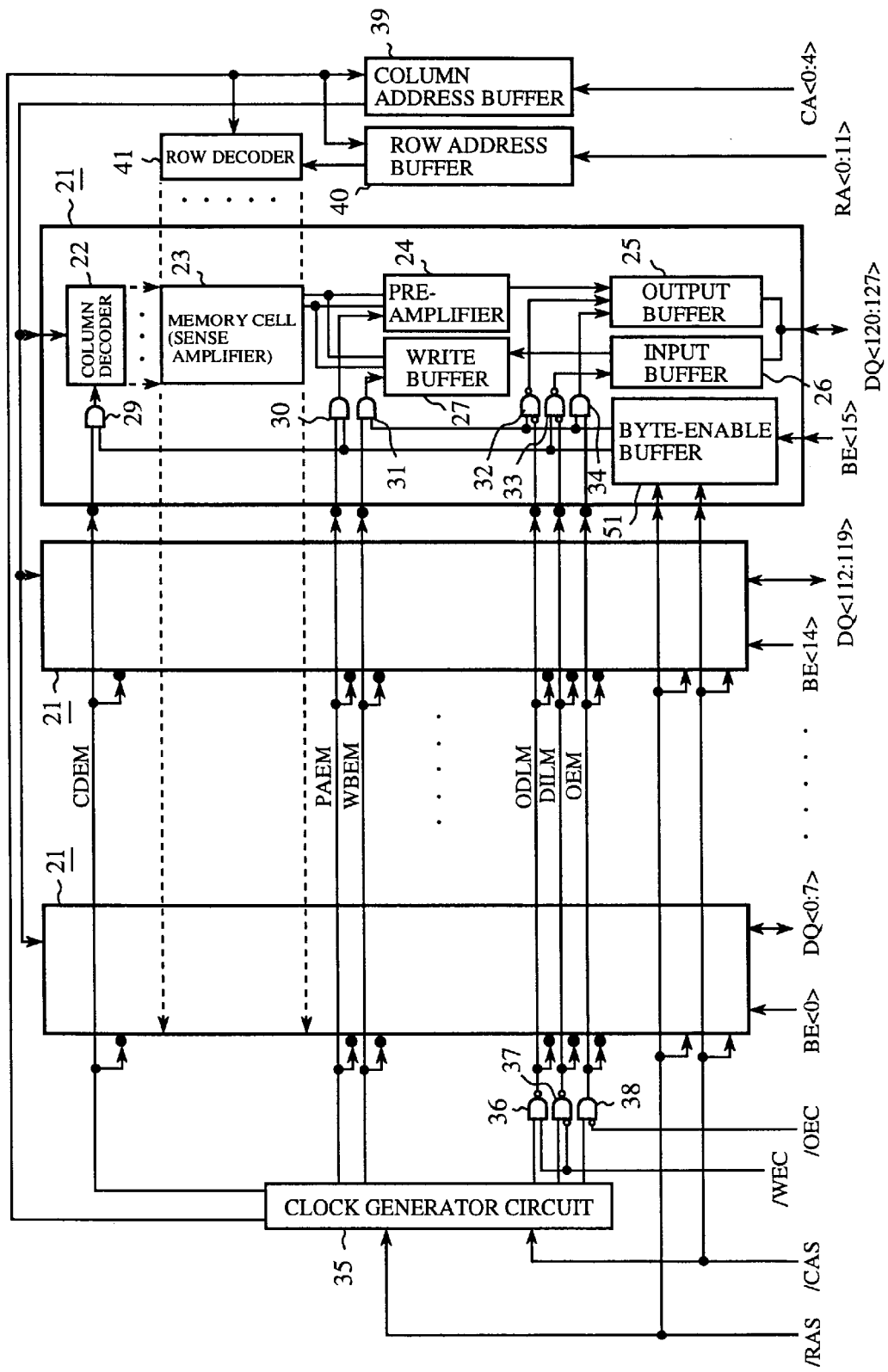
FIG. 7 is a schematic diagram showing the memory device according to a second embodiment of the present invention.
Figure 8:
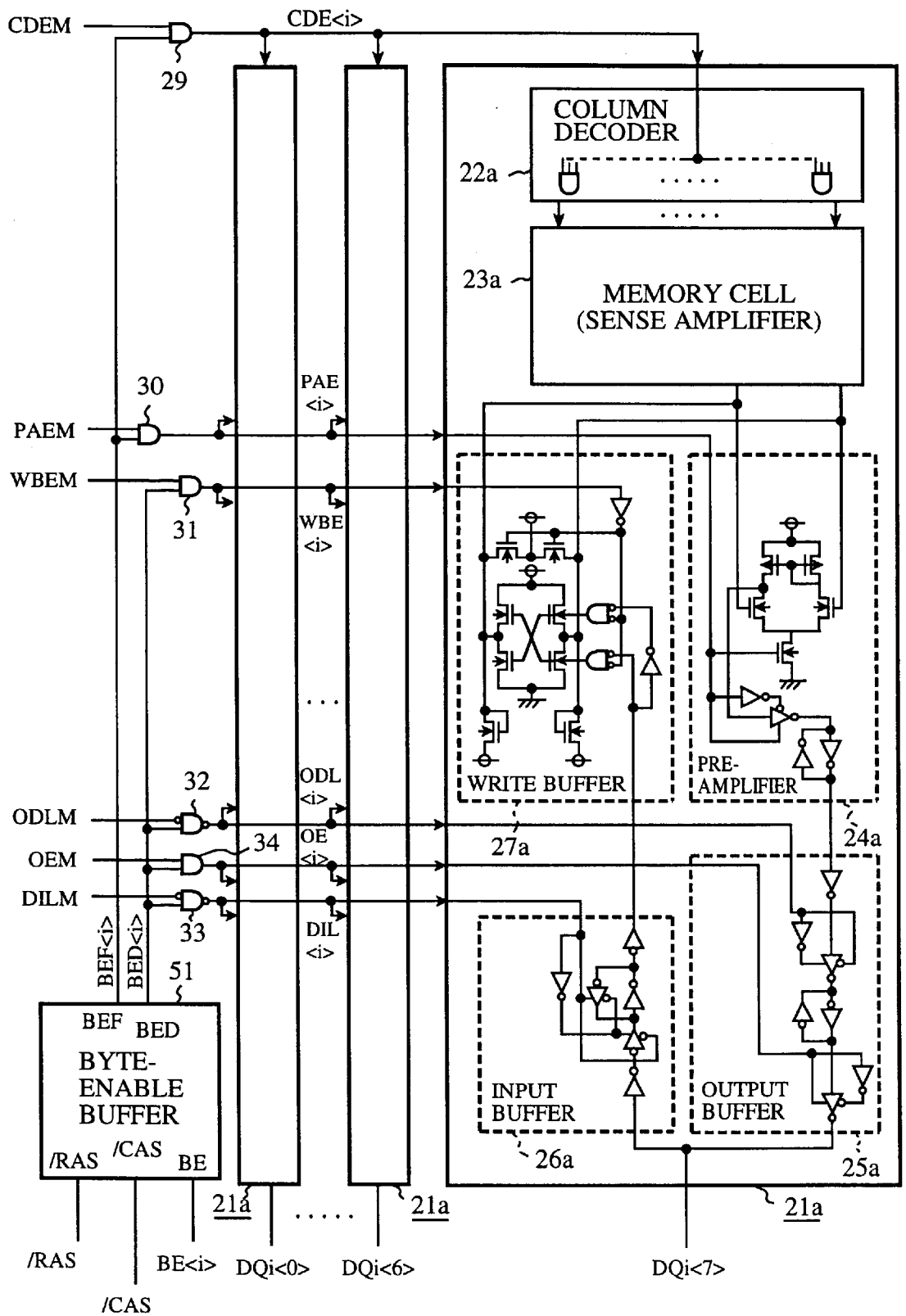
FIG. 8 is a schematic diagram showing the detailed inner configuration of the memory block 21.

FIG. 7 is a block diagram of the memory device according to a second embodiment of the present invention, and FIG. 8 is a block diagram showing the detailed inner configuration of the memory block 21. In these figures, the same reference characters indicating the same or corresponding portions of FIGS. 1 and 2 are omitted here for avoiding unnecessary repetitive explanations.

In FIGS. 7 and 8, reference numeral 51 denotes a byte-enable buffer (selecting means) that outputs a signal for controlling the output buffer 25 and so on in accordance with the level of the BE<i> signal at the change of the /RAS signal and the /CAS signal.

What is different in this second embodiment from the first embodiment is the fact that the byte-enable buffer is controlled also by the /CAS signal other than the /RAS signal. The BEF<i> signal, which is one of the two signals output from the byte-enable buffer 51 controls the column decoder 22 and the preamplifier 24, in cooperation with the CDEM signal and the PAEM signal which are common to all bytes. On the other hand, the other BED<i> signal controls the write buffer 27, the output buffer 25 and the input buffer 26, in cooperation with the WBEM signal, the ODLM signal, the OEM signal and the DILM signal which are all common to all bytes.

Figure 9:
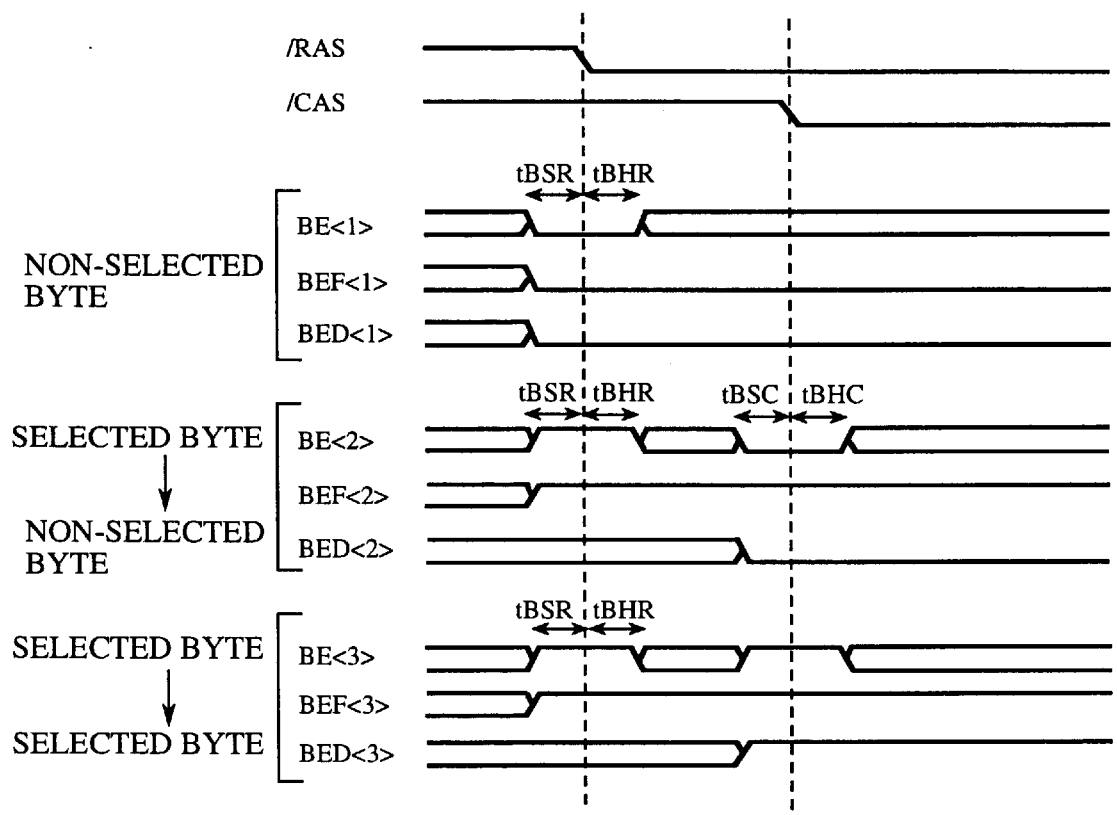
FIG. 9 is a timing chart showing the operation of the byte-enable buffer 51.

As shown in FIG. 9, when the signal level of the BE<i> signal becomes "L" at the fall of the /RAS signal (in the case that the corresponding memory block 21 is a non-selected byte with respect to the row address), the byte-enable buffer 51 outputs the BEF<i> signal of the "L" level and the BED<i> signal of the "L" level.

When the BE<i> signal becomes "H" level at the fall of the /RAS signal (in the case that the corresponding memory block 21 is a selected byte with respect to the row address), the byte-enable buffer 51 outputs the BEF<i> signal of the "H" level, whereas when the BE<i> signal becomes "L" level at the fall of the /CAS signal (in the case that the corresponding memory block 21 is a non-selected byte with respect to the column address), it outputs the BED<i> signal of the "L" level.

Further, when the BE<i> signal becomes "H" level at the fall of the /RAS signal and the /CAS signal (in the case that the corresponding memory block 21 is a selected byte with respect to both the row address and the column address), it puts the BEF<i> signal and the BED<i> signal both of the "H" level.

Figure 10:
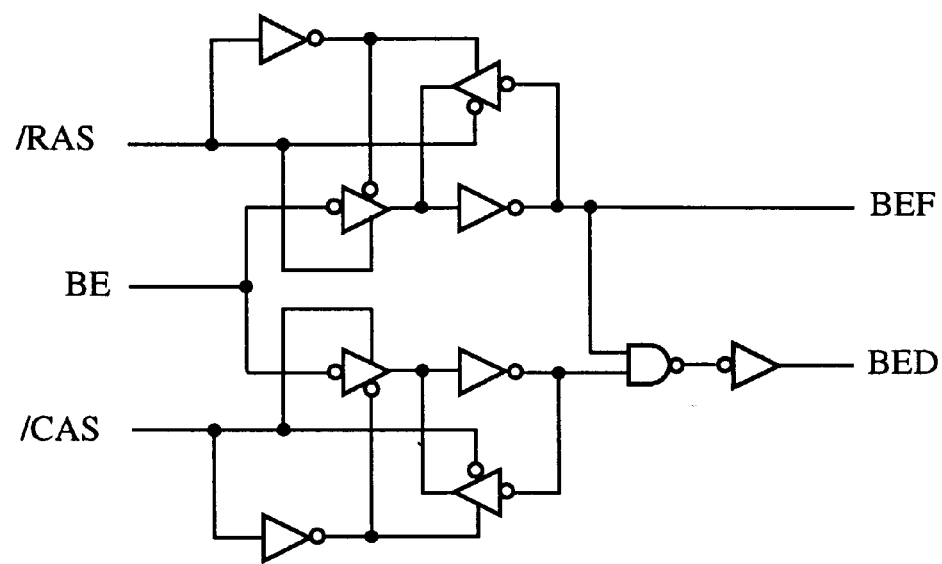
FIG. 10 is a circuit diagram showing an exemplary structure of the byte-enable buffer 51.
Figure 11:
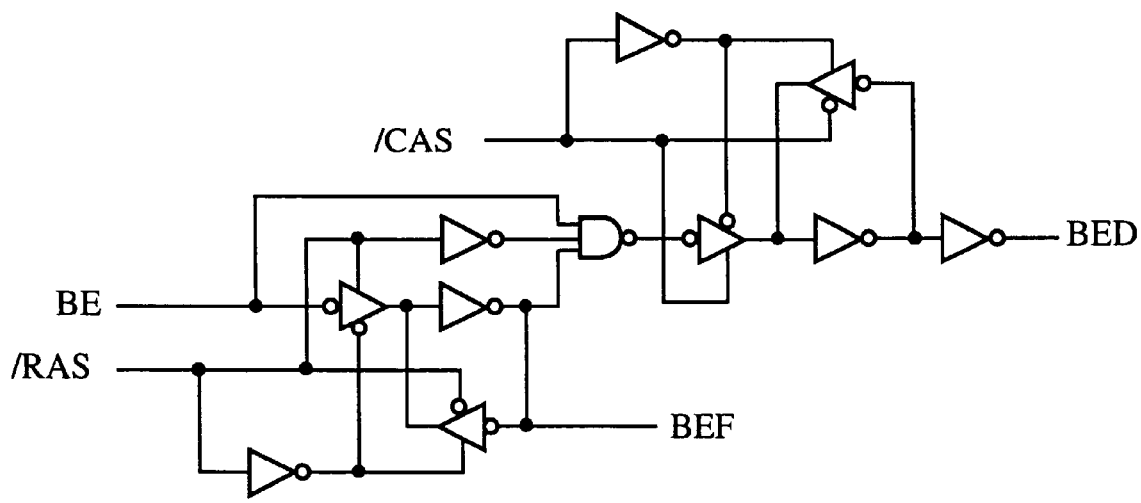
FIG. 11 is a circuit diagram showing an exemplary structure of the byte-enable buffer 51.

FIGS. 10 and 11 are exemplary circuits of the byte-enable buffer 51, which are composed of a plurality of logic circuits.

The operation of the memory device according to the second embodiment is now explained as follows.

Figure 12:
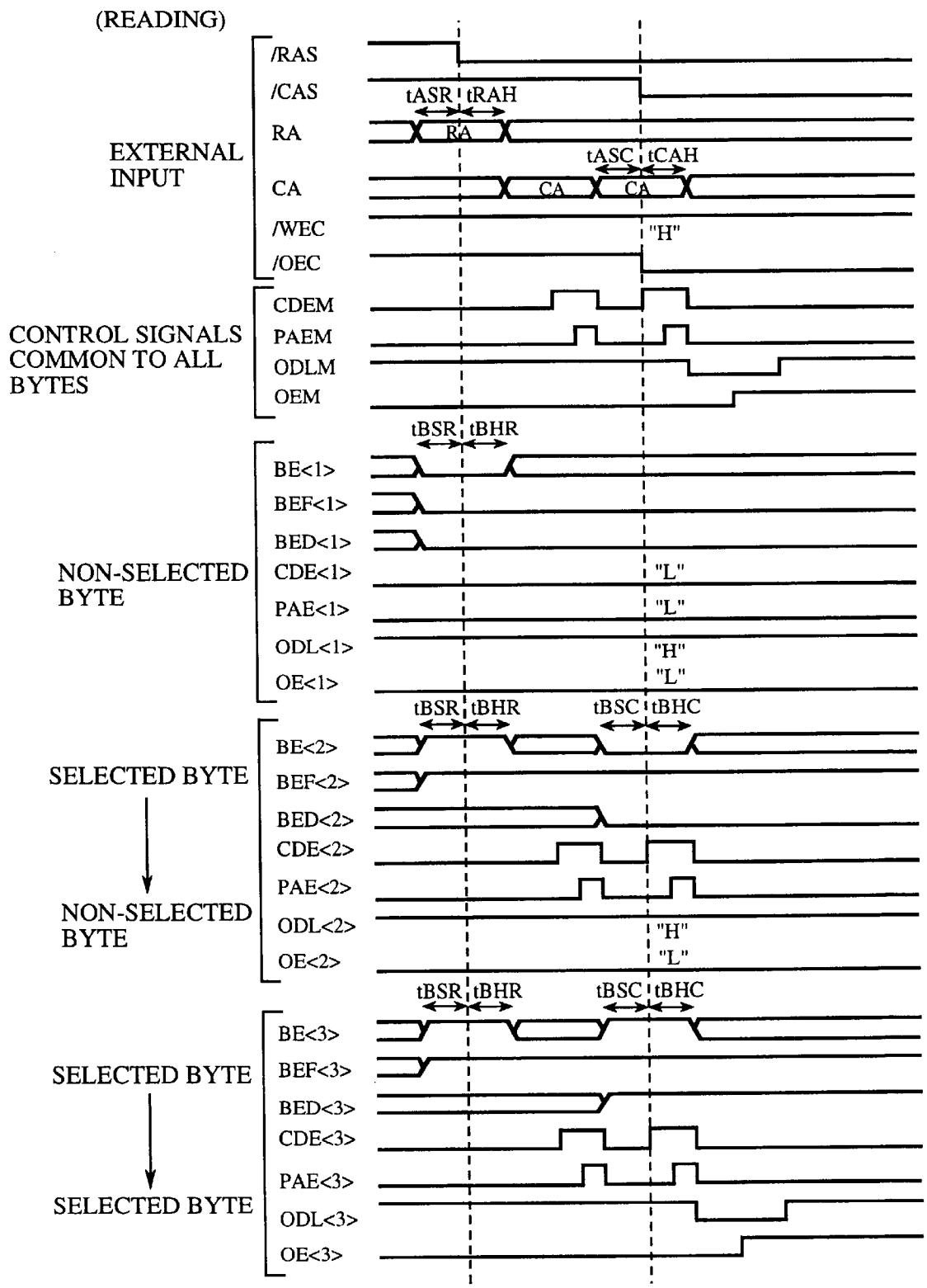
FIG. 12 is a timing chart showing the operation performed in the data reading mode.
Figure 13:
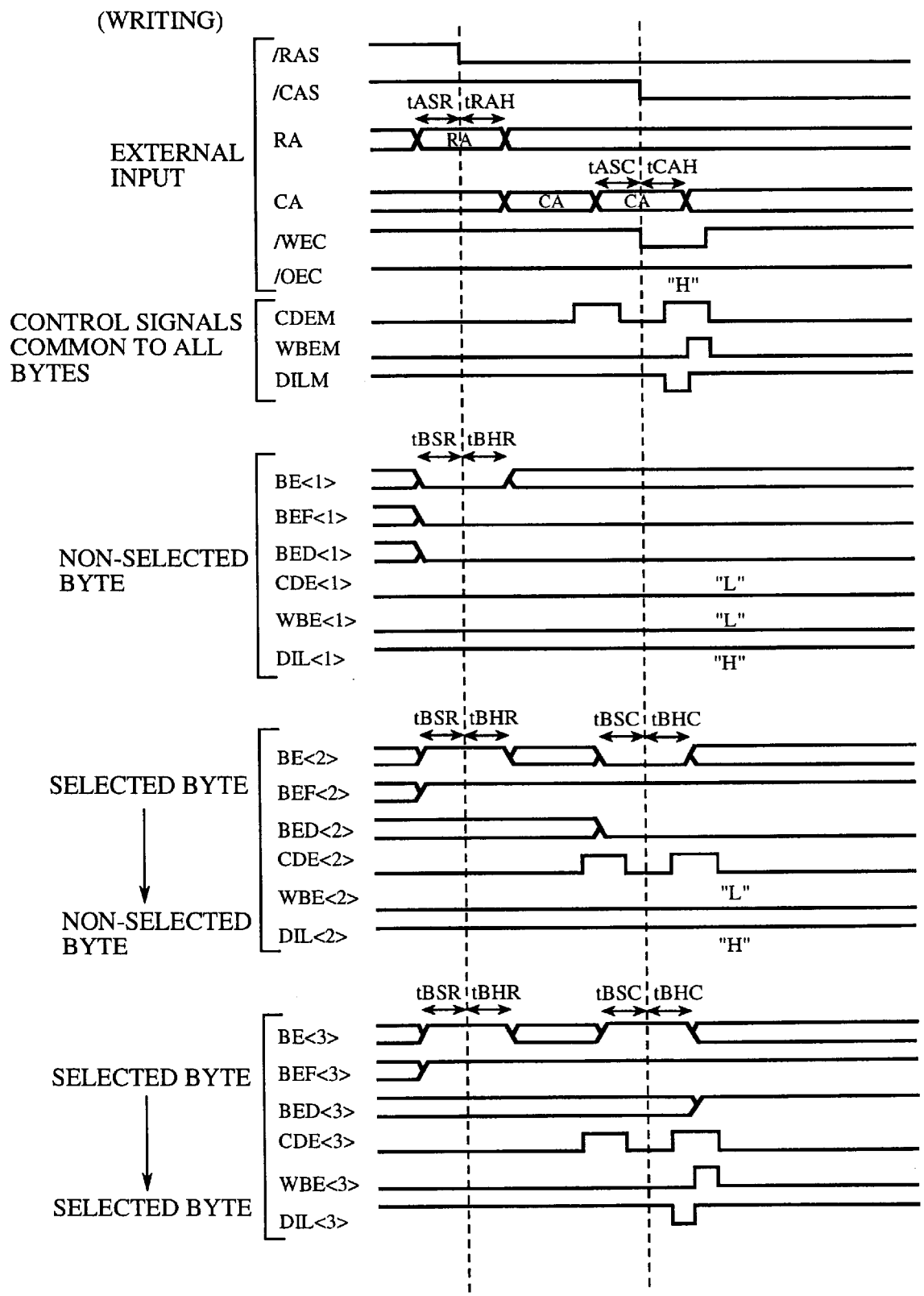
FIG. 13 is a timing chart showing the operation performed in the data writing mode.

The explanation is given with reference to FIGS. 12 and 13, on the assumption that the memory block 21 which is controlled by the BE<1> signal is a non-selected byte with respect to the row address, the memory block 21 which is controlled by the BE<2> signal is a selected byte with respect to the row address and a non-selected byte with respect to the column address, and the memory block 21 which is controlled by the BE<3> signal is a selected byte with respect to both the row address and the column address.

Note that the operations of the control signals common to all bytes with respect to the external inputs are same as those of the conventional ones.

In the data reading mode as shown in FIG. 12, since in the non-selected byte with respect to the row address, the level of the BE<1> becomes "L" at the fall of the /RAS signal, the level of the BEF<1> signal and that of the BED<1> signal both become "L".

Due to this, the level of the CDE<1> signal, the PAE<1> signal and of the OE<1> signal all become "L" and the level of the ODL<1> signal becomes "H", so that the column decoder 22, the preamplifier 24 and the output buffer 25 do not operate, and thus the data in the memory cell 23 is not output.

Further, as to the byte which is selected with resect to the row address, and non-selected with respect to the column address, since the level of the BE<2> signal becomes "H" at the fall of the /RAS signal, the BEF<2> signal becomes "H" level, whereas since the level of the BE<2> signal becomes "L" at the fall of the /CAS signal, the BED<2> signal becomes "L".

Accordingly, since the CDE<2> signal and the PAE<2> signal become pulse signals of "H" level due to the CDEM signal and the PAEM signal which are common to all bytes, the column decoder 22 and the preamplifier 24 operate.

However, since the BED<2> signal is in the "L" level, the ODL<2> signal becomes "H" and the OE<2> signal becomes "L", and thus the output buffer 25 does not operate, the data held by the latch of the preamplifier 24 is not written into the latch of the output buffer 25, and subsequently no data is output from the latch of the output buffer 25.

Further, as to the selected byte with respect to both the row address and the column address, the signal level of the BE<3> signal becomes "H" at the fall of the /CAS signal, so that the level of the BEF<3> signal and that of the BED<3> signal both become "H".

Due to this, since the level of the CDE<3> signal, the PAE<3> signal, the ODL<3> signal and of the OE<3> signal all become pulse signals of either "L" or "H" level, because of the CDEM signal, the PAEM signal, the ODLM signal and the OEM signals, the column decoder 22, the preamplifier 24 and the output buffer 25 operate, and thus the data in the memory cell 23 is output from the output buffer 25.

Next, in the data writing mode as shown in FIG. 13, since as to the non-selected byte with respect to the row address, the level of the BE<1> signal becomes "L" at the fall of the /RAS signal, the BEF<1> signal and the BED<1> signal both become "L".

Due to this, the level of the CDE<1> signal and that of the WBE<1> signal become "L", and the level of the DIL<1> signal becomes "H", so that the column decoder 22, the write buffer 27 and the input buffer 26 do not operate, and thus neither taking of the input data nor writing of the data into the memory cell 23 is performed.

Further, as to the byte which is selected with resect to the row address, and non-selected with respect to the column address, since the level of the BE<2> signal becomes "H" at the fall of the /RAS signal, the BEF<2> signal becomes "H" level, whereas since the level of the BE<2> signal becomes "L" at the fall of the /CAS signal, the BED<2> signal becomes "L".

Accordingly, since the CDE<2> signal becomes a pulse signal of "H" level due to the CDEM signal which is common to all bytes, the column decoder 22 operates.

However, since the BED<2> signal is in the "L" level, the level of the WBE<2> is "L" and the level of the DIL<2> signal is "H", the write buffer 27 and the input buffer 26 do not operate, and thus neither taking of the input data nor writing of the data into the memory cell 23 is performed.

Still further, as to the selected byte with respect to both the row address and the column address, the signal level of the BE<3> signal becomes "H" at the fall of the /RAS signal and the /CAS signal, so that the level of the BEF<3> signal and that of the BED<3> signal both become "H".

Due to this, since the level of the CDE<3> signal, the WBE<3> signal and of the DIL<3> signal all become pulse signals of either "L" or "H" level, because of the CDEM signal, the WBEM signal and the DILM signal, the column decoder 22, the write buffer 27 and the input buffer 26 operate, and thus the data is written into the memory cell 23.

As is obvious form the above, according to this second embodiment, since it is arranged such that an access-target memory cell is selected from a plurality of memory cells in accordance with the level of the BE<i> signal at the fall of /RAS signal and that of the /CAS signal, in the case that the corresponding memory block 21 is a non-selected byte, the circuits that start operating due to the fall of the /RAS signal (namely, the column decoder 22, the preamplifier 24 and the output buffer 25 in the data reading mode, and the column decoder 22, the write buffer 27 and the input buffer 26 in the data writing mode) can be inactivated, and as a result, the electric power consumed for byte-unit accessing operation can be reduced.

Further, even in the case of the byte which is selected with resect to the row address, if it is non-selected with respect to the column address, only the output buffer 25 stops operating in the data reading mode, whereas the write buffer 27 and the input buffer 26 stop operating in the data writing mode. Due to this, during the time period between the fall of the /RAS signal and the fall of the /CAS signal, the column decoder 22 and the preamplifier 24 operate in accordance with the change of the column address, and thereafter when the /CAS signal rises, the column decoder 22 and the preamplifier 24 operate in accordance with the change of the column address, so that the consecutive access to other different bytes can be carried out even without raising the level of the /RAS signal.

It is to be noted that since the BE<i> signal is formed independently of the /RAS signal and the /CAS signal, if, as shown in FIGS. 12 and 13, a decoder circuit for generating the BE<i> signal having set-up time (tBSR, tBSC) and hold time (tBHR, tBHC) at the fall of the /RAS signal and the /CAS signal is formed, the circuits that start operating immediately after the fall of the /RAS signal and the /CAS signal can be inactivated.

Further, if these set-up time (tBSR, tBSC) and the hold time (tBHR, tBHC) of the BE<i> signal are set with respect to the set-up time (tASR) and the hold time (tRAH) of the row address of the DRAM, and to the set-up time (tASC) and the hold time (tCAH) of the column address of the DRAM in such a relation as tASR=tBSR, tRAH=tBHR, tASC=tBSC, and tCAH=tBHC, then the BE<i> signal they can be treated as the row and column addresses.

(Third Embodiment)

Changing of the bus width of the DRAM has not been referred to in the first and second embodiments. However, as shown in FIG. 14, since the bus width of the memory device in the second embodiment (128-bit DRAM core) is changed as occasion demands, a decoder circuit 60 for generating the BE<i> signal (byte-enable signal) in accordance with the address signal may be provided.

Figure 14:
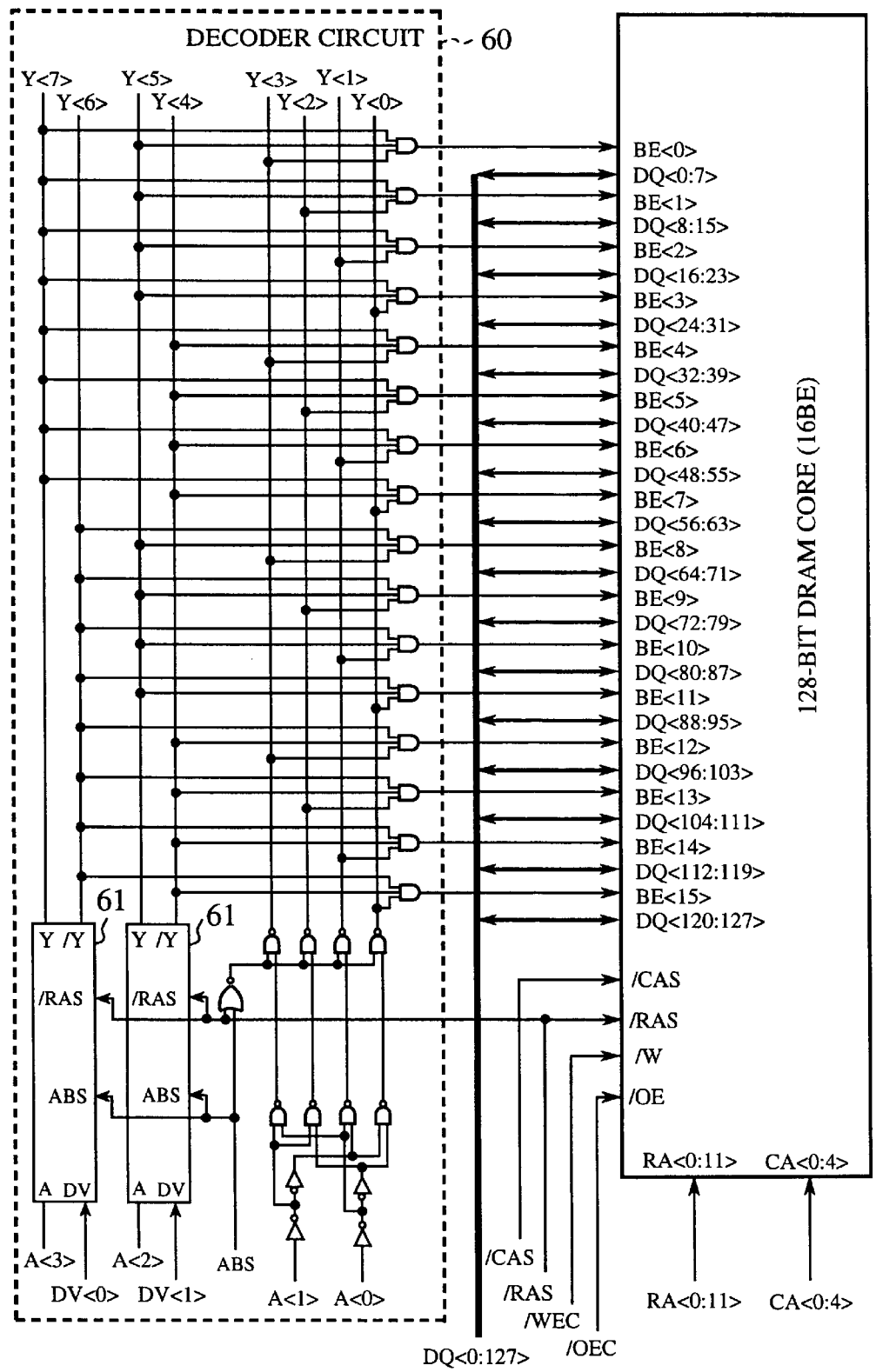
FIG. 14 is a circuit diagram showing the DRAM core and the decoder circuit.

FIG. 14 is a circuit diagram showing the DRAM core which is a DRAM having a byte selecting function by use of the /RAS signal and the /CAS signal, and a decoder circuit for generating the BE<i> signal in accordance with the address signal.

Figure 20:
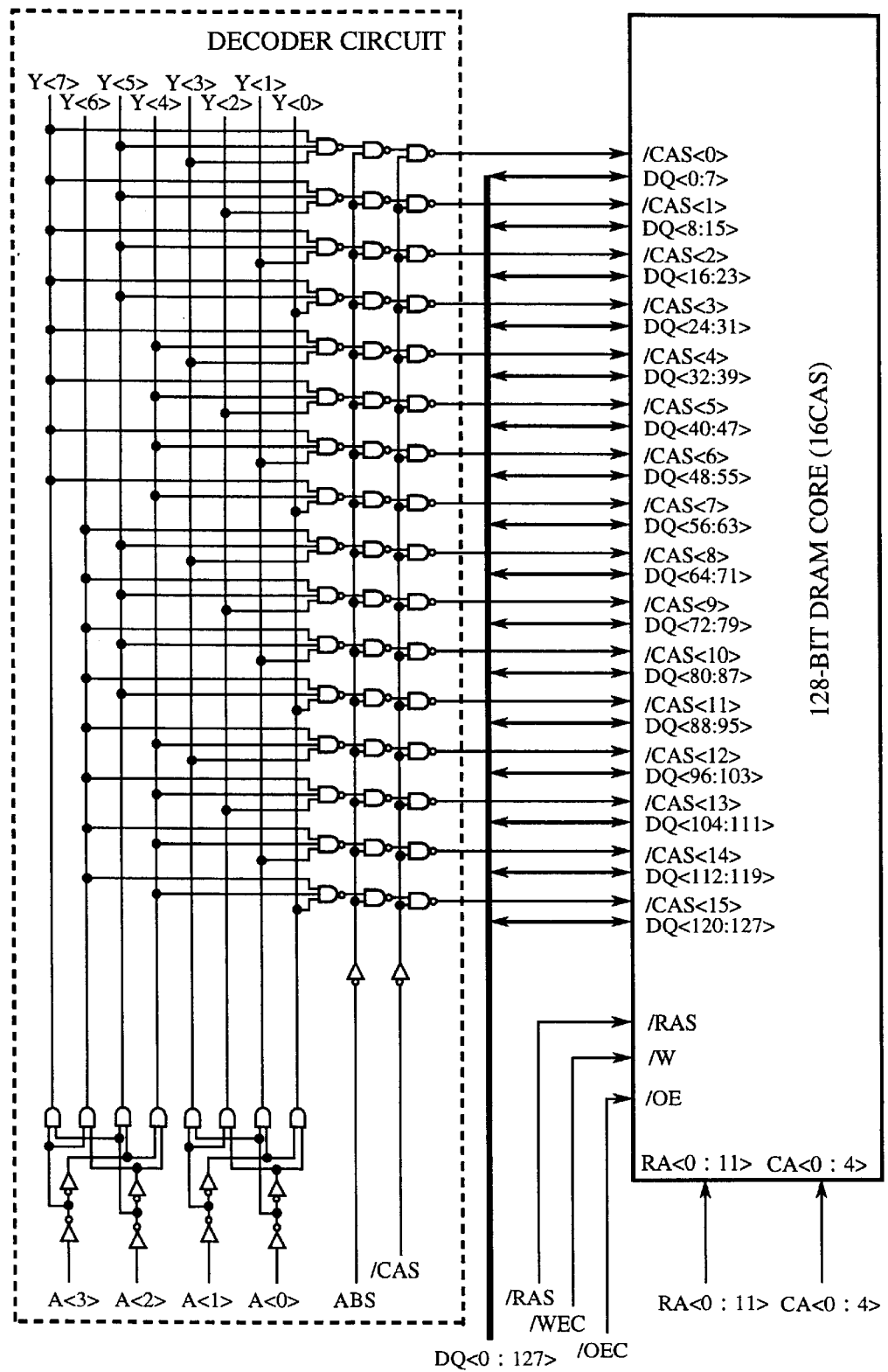
FIG. 20 is a circuit diagram of the decoder circuit.
Figure 21:
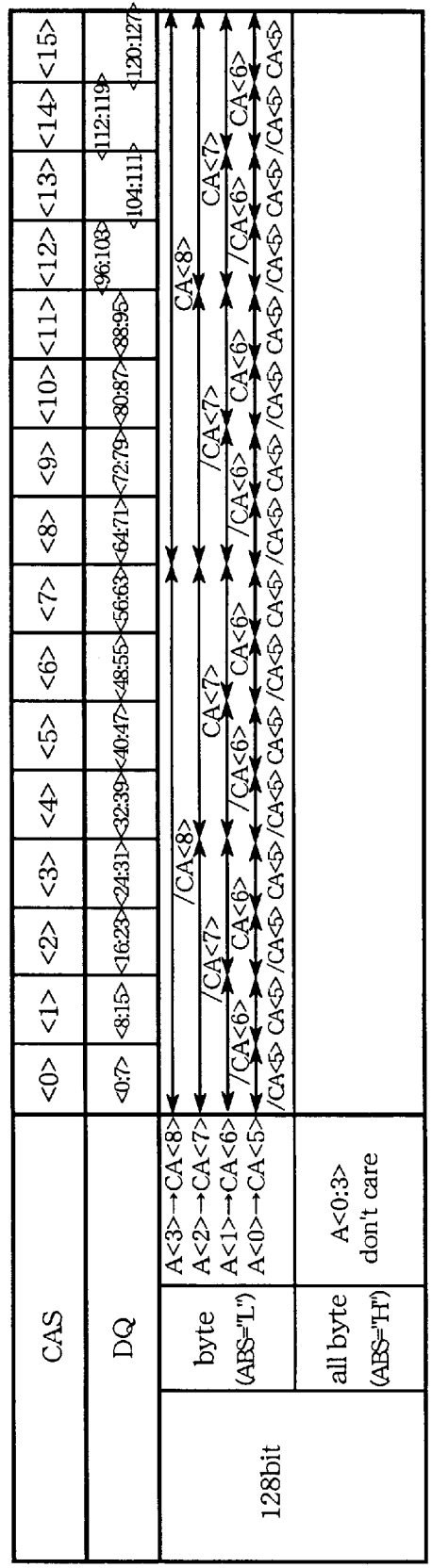
FIG. 21 is a diagram showing the data corresponding to each of the CAS<i> signal and an assignment of the address signals A<0~3> to the column address CA<5~8> in the byte-unit accessing operation.
Figure 22:
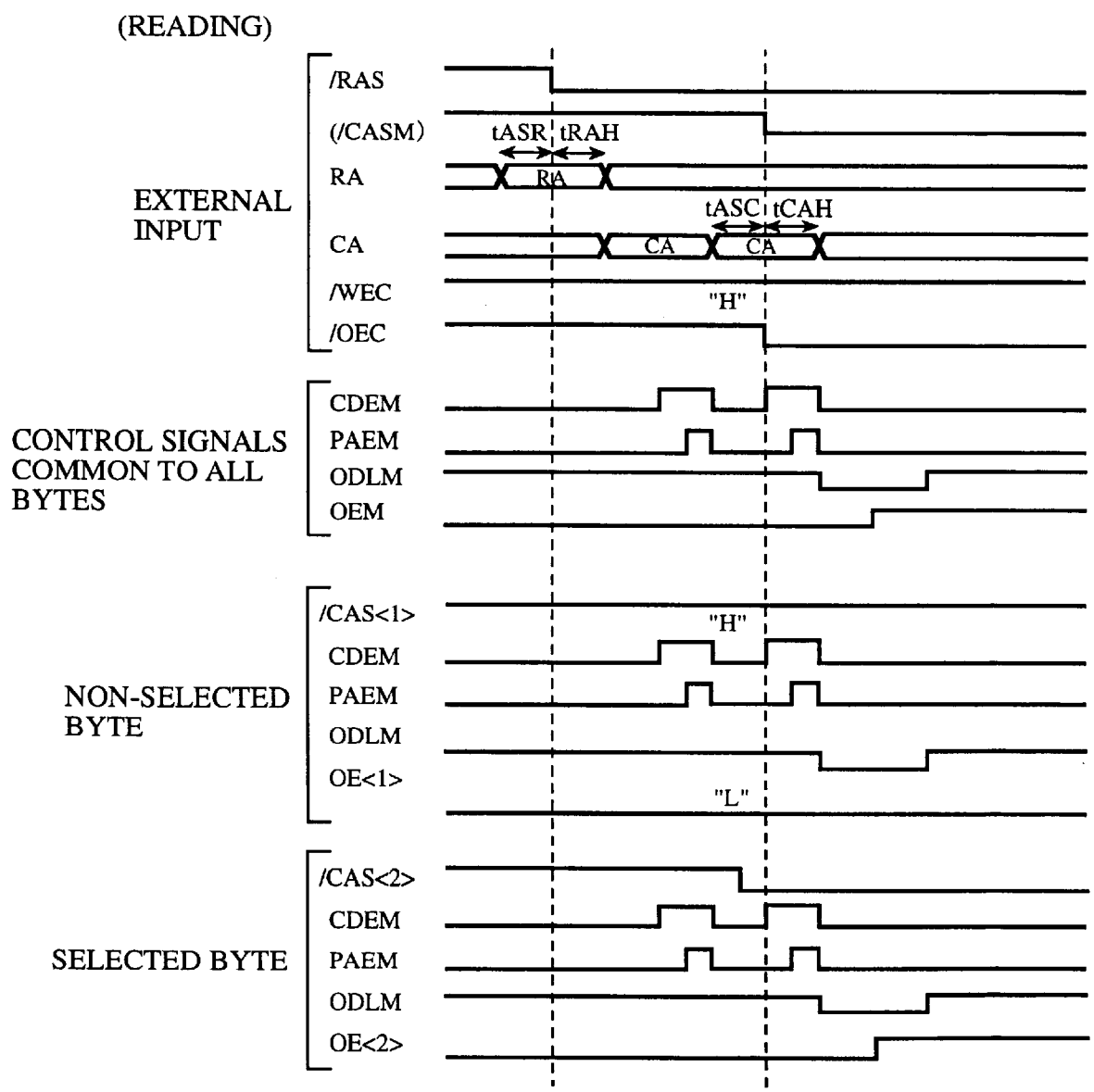
FIG. 22 is a timing chart showing the operation performed in the data reading mode.
Figure 23:
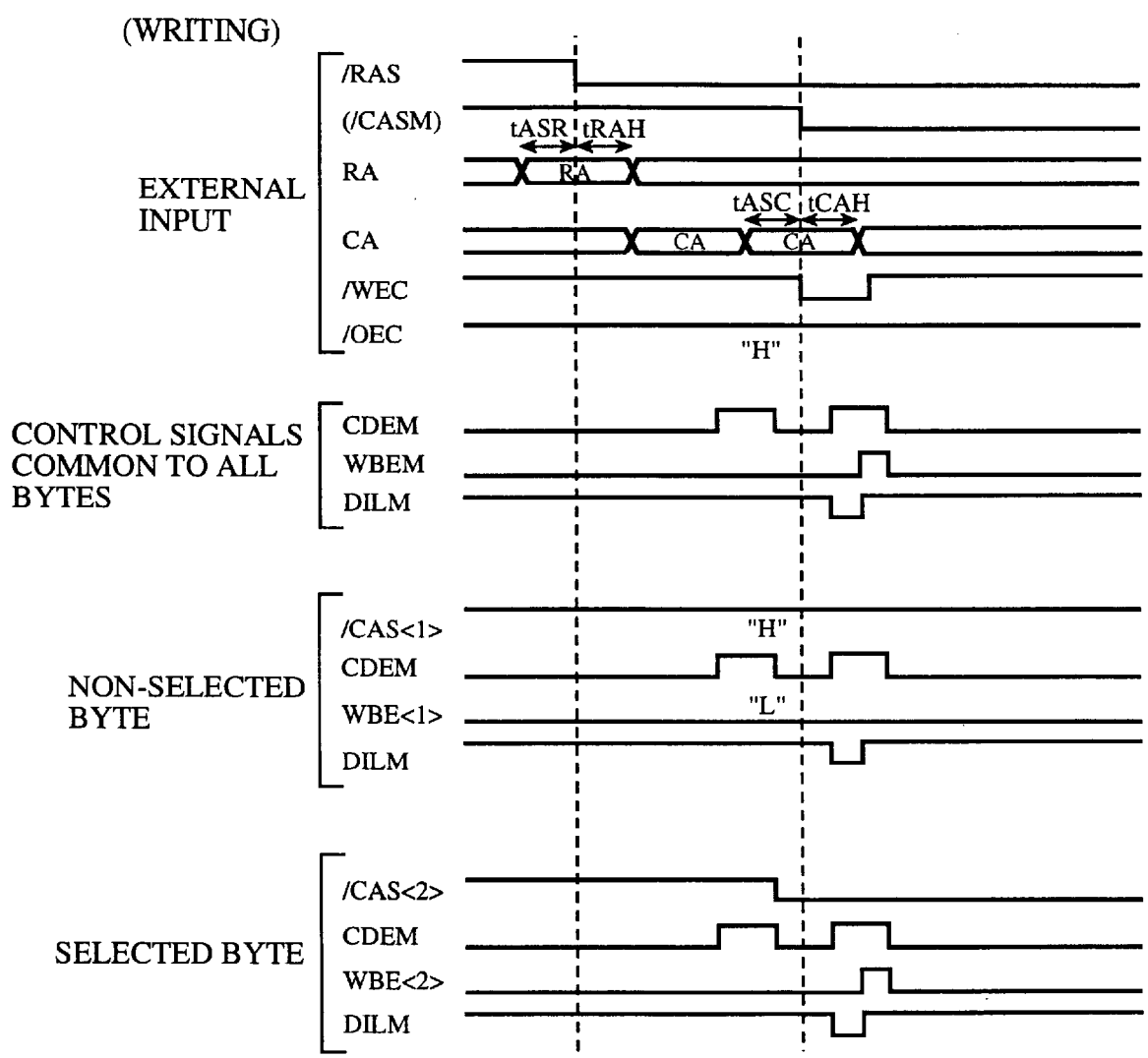
FIG. 23 is a timing chart showing the operation performed in the data writing mode.

This decoder circuit is different from the conventional decoder circuit (refer to FIG. 20) in that the decoder circuit is unrelated to the /CAS signal, but controlled by the /RAS signal instead.

Figure 16:
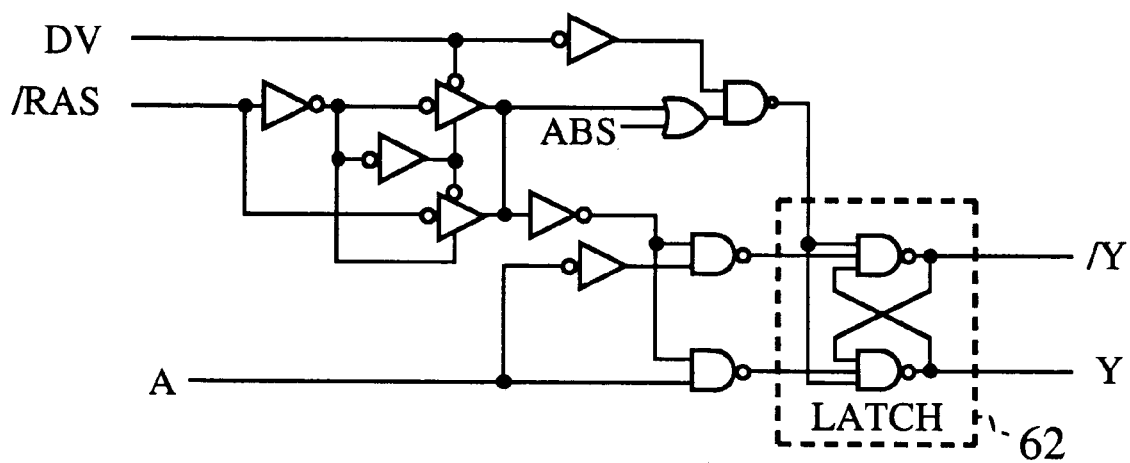
FIG. 16 is a circuit diagram showing an exemplary structure of the predecoder circuit 61.

Note that reference numeral 61 in FIG. 14 denotes a predecoder circuit for generating predecoded signals corresponding to the level of DV signals, one example of which is shown in FIG. 16. In the figure, reference numeral 62 is a latch circuit.

The operation of the memory device according to the third embodiment of the present invention is as explained below.

First, the operation of predecoded signals Y<0~3> with respect to address signals A<0,1> of FIG. 14 is explained.

If the level of the /RAS signal is "H" when the level of the ABS signal is "L", then the level of the predecoded signals Y<0~3> is "H", irrespective of the level of the address signals A<0,1>.

On the other hand, if the level of the /RAS signal is "L" under the same condition, the predecoded signals Y<0~3> become the predecoded signals of the address signals A<0,1>.

If the level of the ABS signal is "H", the level of the predecoded signals Y<0~3> is "H" irrespective of the /RAS signal.

Figure 15:
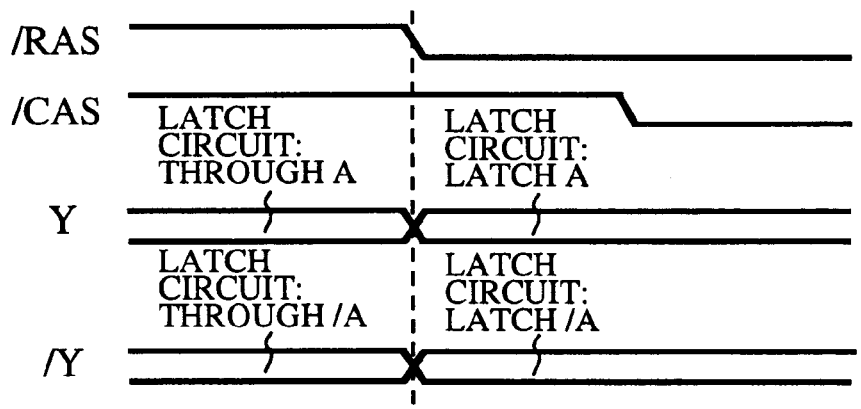
FIG. 15 is a timing chart showing the operation of the predecoder circuit 61.
Figure 15:
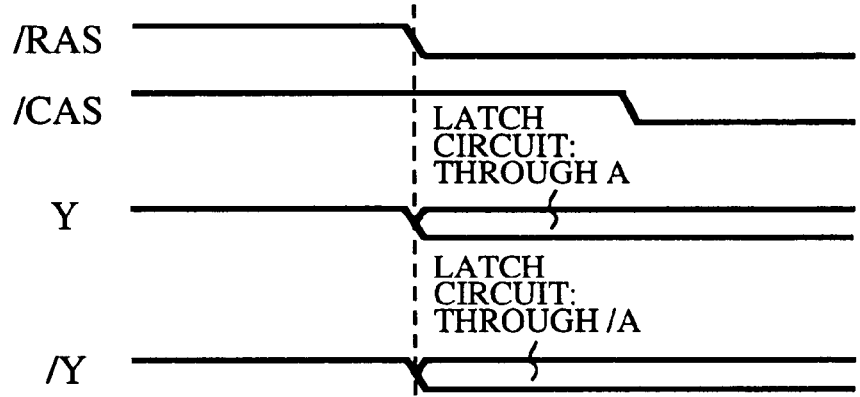
Figure 15:
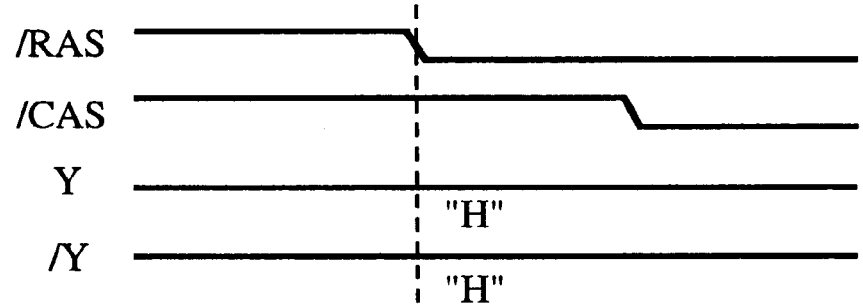

Second, the operation of the predecoded signals Y<4~8> defined by predecoder circuits 61 is explained with reference to FIGS. 15 and 16.

If the level of the /RAS signal becomes "H" when the level of a DV signal is "H", the latch 62 of the predecoder circuit 61 becomes "through", regardless of the ABS signal that selects all bytes, whereas if the /RAS signal becomes "L", the latch 62 of the predecoder circuit 61 holds the predecoded signal Y. On this occasion, the address signal A can be treated as a row address.

In the case where the level of the DV signal is "L", if the level of the /RAS signal becomes "H" when the level of the ABS signal is "L", then the predecoded signals Y and /Y both become "H".

If the level of the /RAS signal becomes "L" under the same condition, the latch 62 of the predecoder circuit 61 becomes "through", and generates a predecoded signal A of the address signal A. On this occasion, the address signal A can be treated as a column address.

In the case where the level of the DV signal is "L", and that of the ABS signal is "H", then the level of the predecoded signals Y and /Y both maintain the "H" level, regardless of the state of the /RAS signal, and has nothing to do with the address signal A.

As is obvious from the above, since it is arranged in such a manner that a decoder circuit for generating the BE<i> signal corresponding to an address signal is provided according to the third embodiment of this invention, the bus width of the DRAM can be readily changed by switching the DV signal, and by connecting mutually the data input/output DQs in the DRAM.

Figure 17:
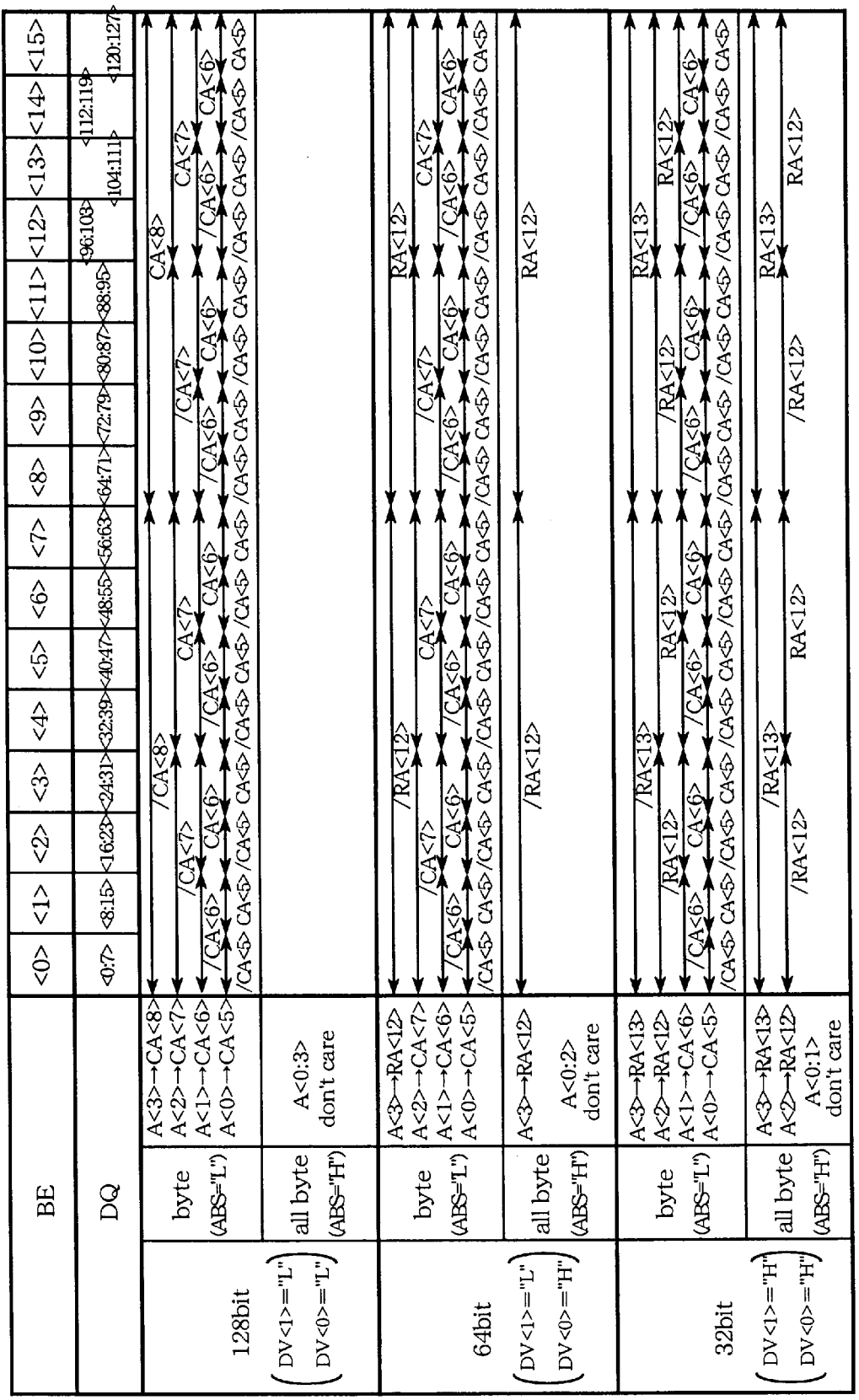
FIG. 17 is an illustration showing the bus width of the DRAM core in use that varies in accordance with the level of the DV signals, and the address specified for each case.
Figure 18:
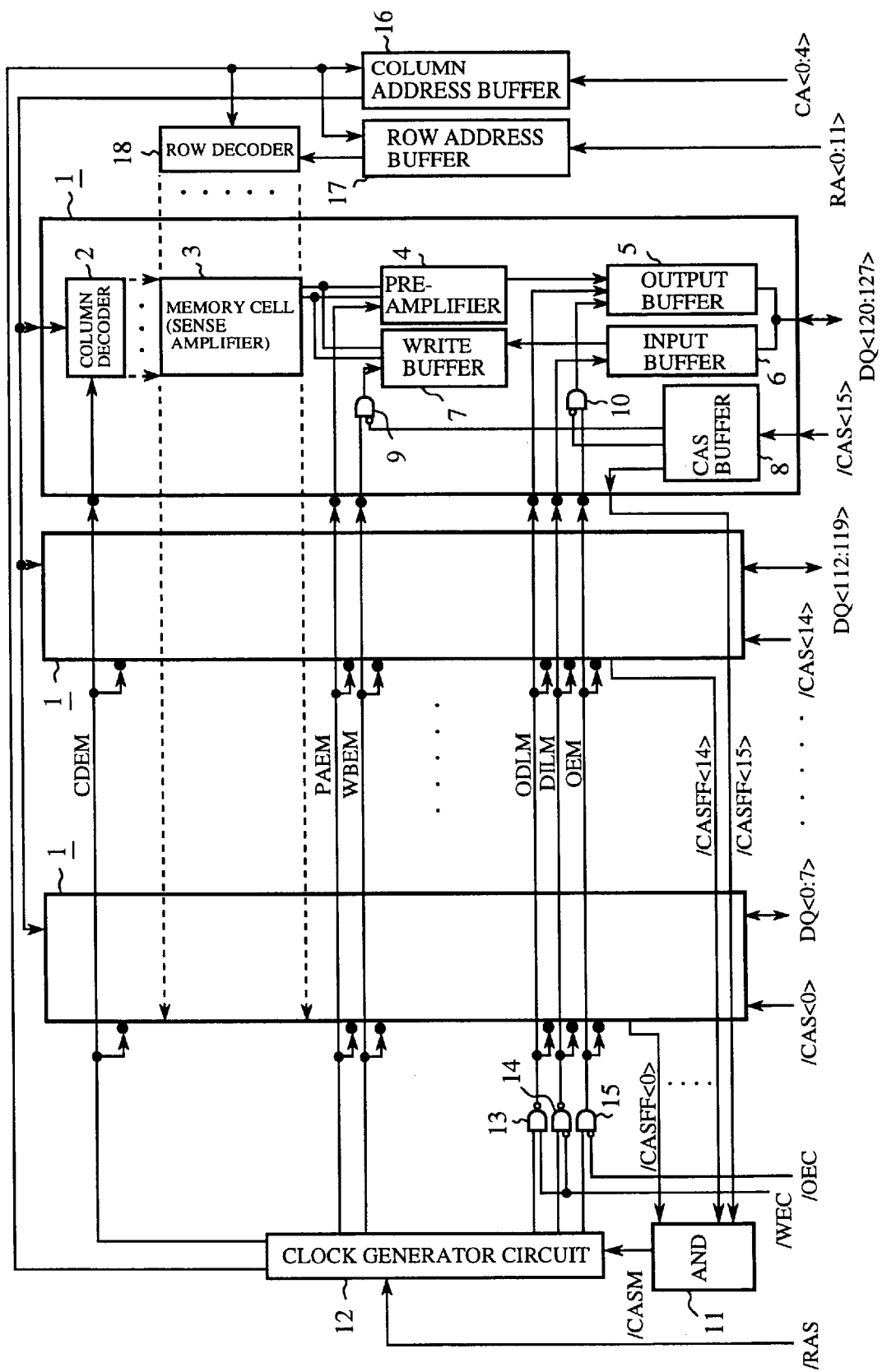
FIG. 18 is a schematic diagram showing the conventional memory device.
Figure 19:
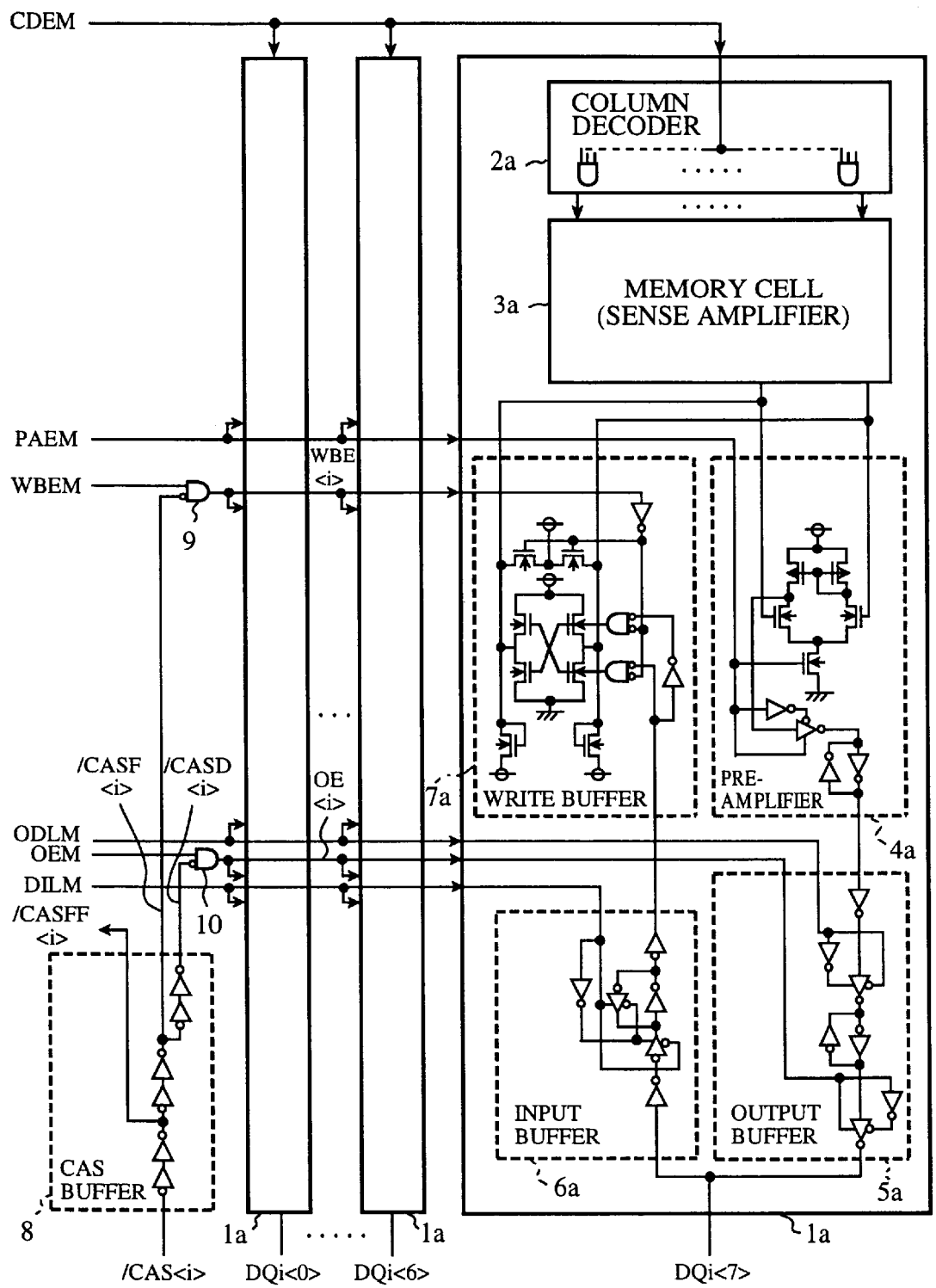
FIG. 19 is a schematic diagram showing the detailed inner construction of the memory block 1.

Here, FIG. 17 is an illustration showing the relation of the bus width of the DRAM core in use that varies in accordance with the level of the DV signals, and the address specified for each case.

As explained heretofore, since it is arranged according to the present invention in such a manner that an access-target memory cell is selected out of a plurality of memory cells in accordance with the level of the byte-enable signal at the timing when the level of the row address strobe signal changes, electric power that may be consumed at the time of executing a byte-unit access to the wide-bus DRAM can be reduced.

Further, according to the present invention, since it is arranged such that when the level of the byte-enable signal associated with an arbitrary memory cell is in the "L" level at the fall of the row address strobe signal, that memory cell is eliminated from being a target memory cell, whereas when the level of the byte-enable signal associated with an arbitrary memory cell is in the "H" level, that memory cell is determined to be an access target, the operation of the reading means and writing means which are connected with the thus eliminated memory cell from being a target memory cell can be inactivated.

Further, according to the present invention, since it is arranged such that the operation of the reading means and writing means which are connected with a memory cell eliminated from being a target memory cell can be inactivated, electric power which may otherwise be consumed for unnecessary operations of the writing means and the reading means can be avoided.

Further, according to the present invention, since it is arranged such that one memory cell is selected from a plurality of memory cells in accordance with the level of the byte-enable signal at the timing when the level of the row address strobe signal and that of the column address strobe signal change, electric power that may be consumed at the time of executing a byte-unit access to the wide-bus DRAM can be reduced.

Further, according to the present invention, since it is arranged such that only when the level of the byte-enable signal associated with an arbitrary memory cell is in the "H" level at the fall of the row address strobe signal and that of the column address strobe signal, that memory cell is determined to be an access target, the operation of the reading means and writing means which are connected with the eliminated memory cell from being a target memory cell can be inactivated.

Still further, according to the present invention, since it is arranged such that the reading means and writing means which are connected with a memory cell eliminated from being a target memory cell can be inactivated, electric power which may otherwise be consumed for unnecessary operation of the writing means and the reading means can be avoided.

Still further, according to the present invention, since it is arranged such that even when the level of the byte-enable signal is "H" at the fall of the row address strobe signal, if the level of the byte-enable signal is in the "L" level at the fall of the column address strobe signal, the operation of only some particular elements configuring the reading means and the writing means are inactivated, not only electric power consumption which may otherwise be consumed for unnecessary operations of the writing means and the reading means can be avoided, but other different bytes can be accessed consecutively without raising the row address strobe signal.

Yet still further, since it is arranged according to the present invention such that a byte-enable signal corresponding to an address signal is generated, bus width can be freely changed as occasion demands.

What is claimed is:

1. A memory device comprising:
   a plurality of memory cells configuring a DRAM,
   a selection means for selecting one access-target memory cell out of said plurality of memory cells in accordance with a level of a byte-enable signal when a level of a row address strobe signal changes,
   a reading means for reading byte-unit data from the access-target memory cell selected by said selection means, and
   a writing means for writing byte-unit data into the access-target memory cell selected by said selection means.

2. A memory device according to claim 1, wherein when the level of the byte-enable signal associated with an arbitrary memory cell is in a "L" level at a fall of the row address strobe signal, said selection means eliminates the memory cell from being an access-target memory cell, whereas when the level of the byte-enable signal associated with an arbitrary memory cell is in a "H" level, said selection means determines the memory cell to be an access-target memory cell.

3. A memory device according to claim 2, wherein said selection means inactivates reading means and writing means which are connected with the memory cell eliminated from being an access-target memory cell.

4. A memory device comprising:
   a plurality of memory cells configuring a DRAM,
   a selection means for selecting one access-target memory cell out of said plurality of memory cells in accordance with a level of a byte-enable signal when a level of a row address strobe signal and a level of a column address strobe signal change,
   a reading means for reading byte-unit data from the access-target memory cell selected by a selection means, and
   a writing means for writing byte-unit data into the access-target memory cell selected by said selection means.

5. A memory device according to claim 4, wherein said selection means determines an arbitrary memory cell to be an access target memory cell, only when the level of the byte-enable signal associated with said arbitrary memory cell is in a "H" level at a fall of the row address strobe signal and that of the column address strobe signal.

6. A memory device according to claim 5, wherein said selection means inactivates reading means and the writing means which are connected with a memory cell eliminated from being an access-target memory cell.

7. A memory device according to claim 6, wherein even when the byte-enable signal is in the "H" level at the fall of the row address strobe signal, if the byte-enable signal is in a "L" level at a fall of the column address strobe signal, said selection means inactivates only some particular elements configuring the reading means and the writing means.

8. A memory device according to claim 4 further comprising a decode means for generating the byte-enable signal in accordance with an address signal.

* * * * *